(12) United States Patent
Nakata et al.

(10) Patent No.: US 12,538,798 B2
(45) Date of Patent: Jan. 27, 2026

(54) SEMICONDUCTOR APPARATUS COMPRISING LEAD FRAME WITH RECESS FOR WIRES, AND VEHICLE USING THE SAME

(71) Applicant: FUJI ELECTRIC CO., LTD., Kawasaki (JP)

(72) Inventors: Hitoshi Nakata, Kawasaki (JP); Yuichiro Hinata, Kawasaki (JP); Naoyuki Kanai, Kawasaki (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 478 days.

(21) Appl. No.: 18/090,121

(22) Filed: Dec. 28, 2022

(65) Prior Publication Data
US 2023/0260951 A1 Aug. 17, 2023

(30) Foreign Application Priority Data
Feb. 15, 2022 (JP) .................. 2022-021448

(51) Int. Cl.
*H01L 23/00* (2006.01)
*H01L 23/049* (2006.01)
*H01L 23/373* (2006.01)

(52) U.S. Cl.
CPC .......... *H01L 24/37* (2013.01); *H01L 23/049* (2013.01); *H01L 23/3735* (2013.01); *H01L 24/32* (2013.01); *H01L 24/35* (2013.01); *H01L 24/40* (2013.01); *H01L 24/48* (2013.01); *H01L 24/73* (2013.01); *H01L 2224/32225* (2013.01); *H01L 2224/352* (2013.01); *H01L 2224/37011* (2013.01); *H01L 2224/40225* (2013.01); *H01L 2224/48225* (2013.01); *H01L 2224/73221* (2013.01); *H01L 2224/73263* (2013.01); *H01L 2224/73265* (2013.01); *H01L 2924/1203* (2013.01); *H01L 2924/13055* (2013.01); *H01L 2924/13091* (2013.01)

(58) Field of Classification Search
CPC ...................................... H01L 23/049
USPC ................................. 257/666, 694
See application file for complete search history.

(56) References Cited

U.S. PATENT DOCUMENTS

| | | | | |
|---|---|---|---|---|
| 2007/0278629 A1* | 12/2007 | Smith | ............... | H01L 23/49582 257/E23.037 |
| 2010/0181628 A1* | 7/2010 | Kawano | .................. | H01L 24/85 257/692 |
| 2017/0092596 A1* | 3/2017 | Yoshihara | ......... | H01L 23/49579 |
| 2018/0145007 A1 | 5/2018 | Hatano et al. | | |
| 2021/0010871 A1 | 1/2021 | Sato | | |

(Continued)

FOREIGN PATENT DOCUMENTS

| | | | | |
|---|---|---|---|---|
| JP | 2008-028286 A | | 2/2008 | |
| JP | 2010050491 A | * | 3/2010 | ........... H01L 21/566 |
| JP | 2010-171181 A | | 8/2010 | |

(Continued)

*Primary Examiner* — Ajay Arora
(74) *Attorney, Agent, or Firm* — Rabin & Berdo, P.C.

(57) ABSTRACT

A semiconductor apparatus includes a substrate, a semiconductor device arranged on an upper surface of the substrate, a lead frame bonded to an upper surface of the semiconductor device via a bonding material, the lead frame having a first recess on an upper surface thereof, a wire connected to the first recess, and a resin that seals the substrate, the semiconductor device, the lead frame, and the wire.

11 Claims, 13 Drawing Sheets

(56) References Cited

U.S. PATENT DOCUMENTS

2021/0193590 A1\* 6/2021 Wang ........................ G06T 7/70

FOREIGN PATENT DOCUMENTS

| JP | 2016-004796 A | 1/2016 |
| JP | 2019-071399 A | 5/2019 |
| JP | 2019-186510 A | 10/2019 |

\* cited by examiner

US 12,538,798 B2

SEMICONDUCTOR APPARATUS COMPRISING LEAD FRAME WITH RECESS FOR WIRES, AND VEHICLE USING THE SAME

CROSS REFERENCE TO RELATED APPLICATIONS

This application is based upon and claims the benefit of priority of the prior Japanese Patent Application No. 2022-021448, filed on Feb. 15, 2022, the entire contents of which are incorporated herein by reference.

BACKGROUND OF THE INVENTION

Field of the Invention

The present invention relates to a structure of a semiconductor apparatus.

Description of the Related Art

A semiconductor apparatus is an electronic component including a semiconductor device such as an IGBT (insulated gate bipolar transistor), a MOSFET (metal oxide semiconductor field effect transistor), or an FWD (free wheeling diode), and is widely used for a converter, an inverter, and the like of an industrial application or a household electric appliance as an apparatus that controls electric power. In recent years, the semiconductor apparatus has also been used for on-vehicle motor driving control, and hence an increase in current needs to be simultaneously implemented in addition to a reduction in size and weight for improving fuel consumption, and long-term reliability under a high-temperature operating environment for arrangement in an engine compartment has also been required.

Conventionally, in this type of semiconductor apparatus, a gel sealing structure in which a semiconductor device and a wiring are electrically connected to each other via a wire made of aluminum, copper, or the like on a substrate and a case surrounding components such as the substrate and the semiconductor device is filled with silicon-based liquid resin has been mainly used. However, to meet requirements for improvement in performance, as described above, a resin sealing (full-mold) structure using a lead frame (metal wiring board) as a wiring for electrically connecting the semiconductor device and the wiring and using epoxy-based solid resin for a sealing material has started to be adopted. The lead frame is formed into a predetermined shape by subjecting a metal plate to press working, for example. Resin sealing plays roles of ensuring physical protection in a case and insulation between circuits and relaxing a stress at a bonding interface between components, for example. The epoxy-based solid resin used for the resin sealing has an advantage of having higher heat resistance, insulation, and humidity resistance than a silicone gel, and has started to be adopted for products or the like requiring an attention to vibration.

In this type of semiconductor apparatus, a lead frame and another wiring may be connected to each other via a wire to electrically connect the lead frame and the other wiring without changing a shape of the lead frame. Associated techniques include Japanese Patent Laid-Open Nos. 2010-171181 and 2016-004796.

SUMMARY OF THE INVENTION

In this type of semiconductor apparatus, semiconductor devices generate heat as switching operations are performed. Epoxy-based solid resin has a relatively large modulus of elasticity and is hard. Accordingly, when the linear expansion coefficient of the solid resin and the linear expansion coefficient of a lead frame differ from each other, a stress occurs at a bonding interface between the solid resin and the lead frame as respective temperatures of the solid resin and the lead frame rise due to heat generation of a semiconductor device. Due to the stress, the wire may be cracked or disconnected.

The object of the present invention is to prevent from being cracked or disconnected wires in semiconductor devices in which a connection structure between a lead frame and wires on a semiconductor device is sealed with solid resin.

According to an aspect of the present invention, a semiconductor apparatus includes a substrate, a semiconductor device arranged on an upper surface of the substrate, a lead frame bonded to an upper surface of the semiconductor device via a bonding material, a wire connected to a first recess formed on an upper surface of the lead frame, and a sealing material that seals the substrate, the semiconductor device, the lead frame, and the wire.

According to the present invention, in a semiconductor apparatus in which a connection structure between a lead frame and a wire on a semiconductor device is sealed with a sealing material, the wire can be prevented from being cracked or disconnected.

DETAILED DESCRIPTION OF THE PREFERRED EMBODIMENT

A semiconductor apparatus according to an embodiment will be described below with reference to the drawings.

Figure 1:
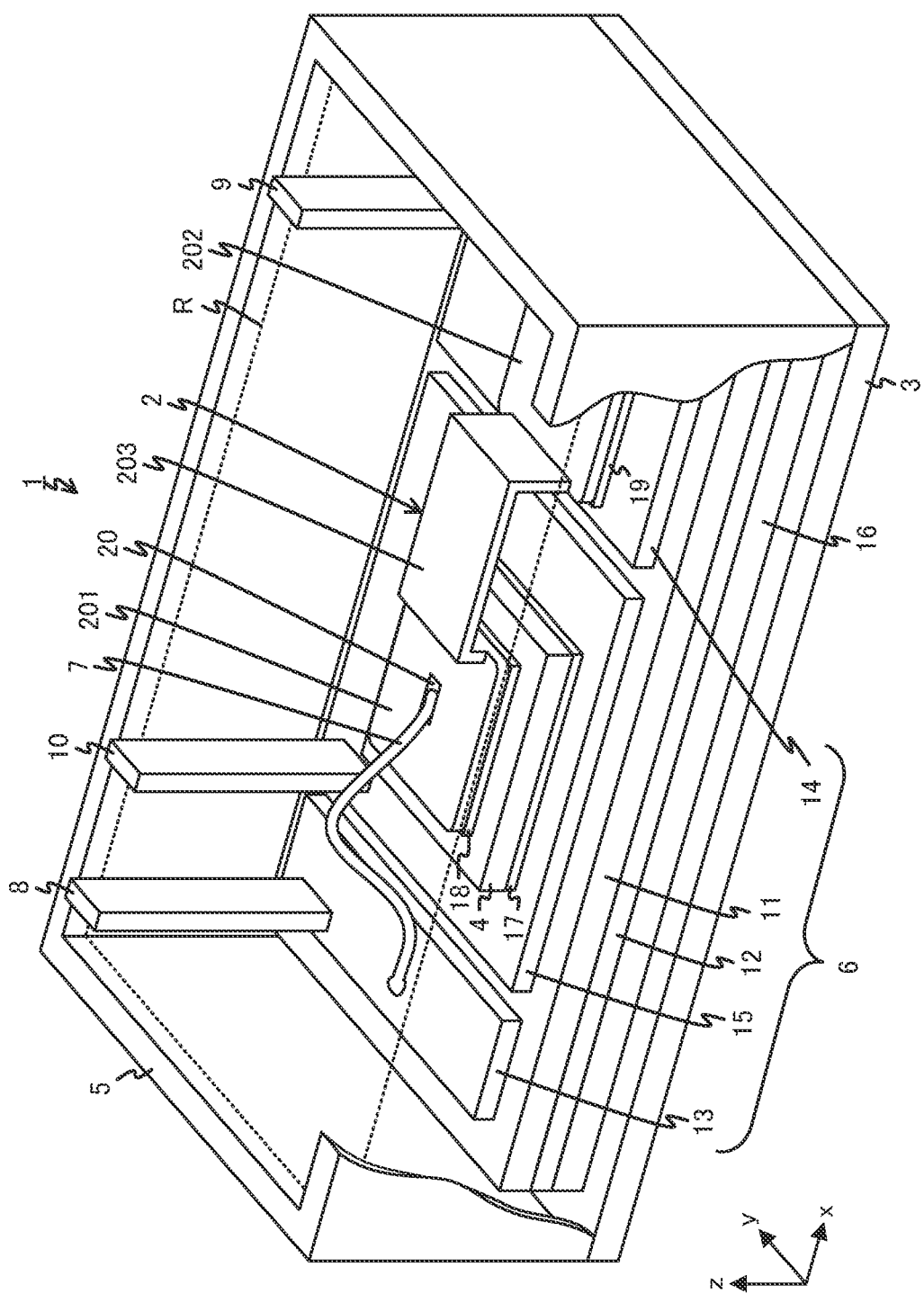
FIG. 1 is a perspective view of a semiconductor apparatus according to an embodiment.
Figure 2:
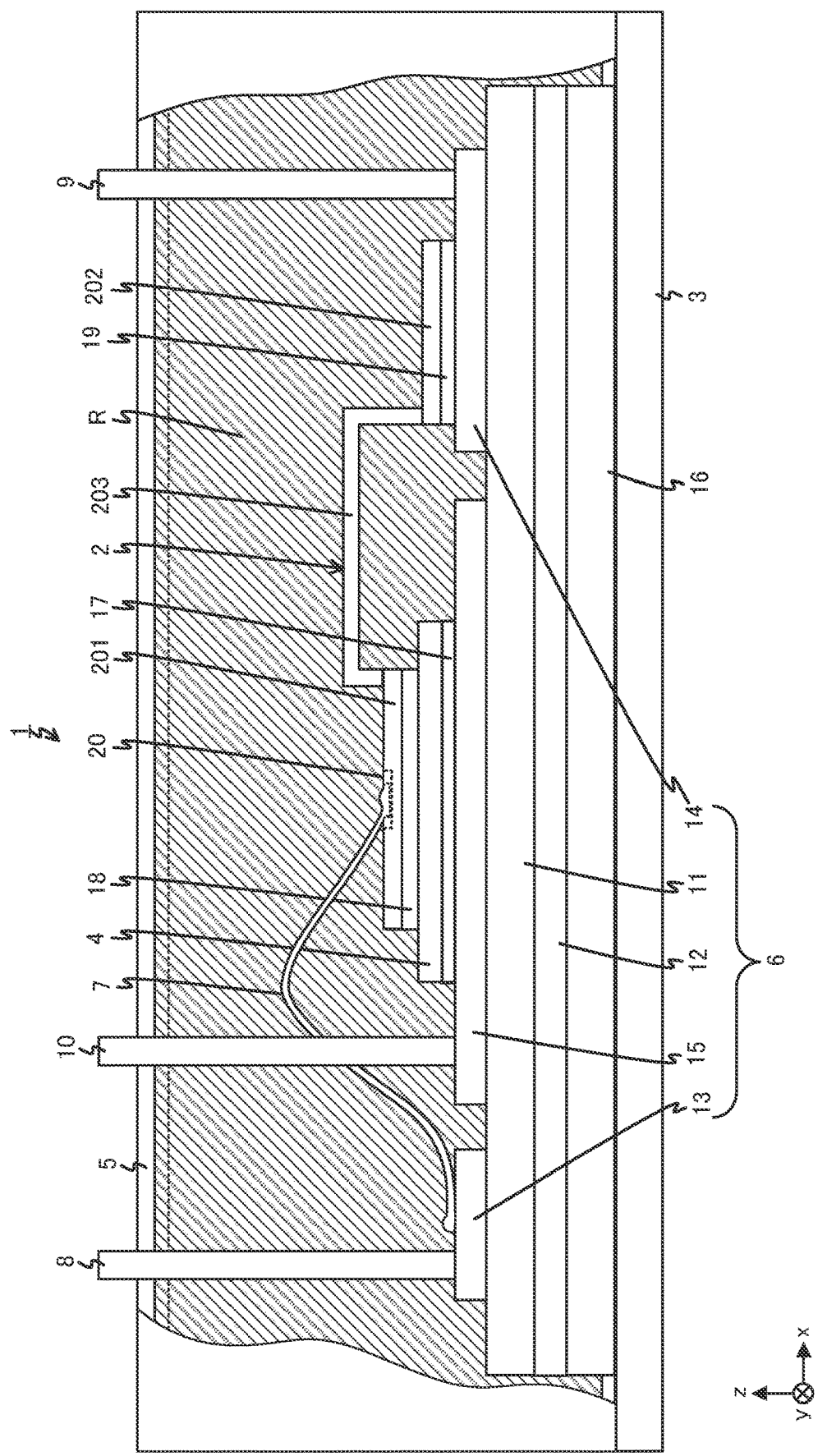
FIG. 2 is a diagram of the semiconductor apparatus illustrated in FIG. 1 as viewed from the front side toward the rear side of a plane of paper in a y-direction.

FIG. 1 is a perspective view of a semiconductor apparatus according to an embodiment. FIG. 2 is a diagram of the semiconductor apparatus illustrated in FIG. 1 as viewed from the front side (negative side) toward the rear side (positive side) of a plane of paper in a y-direction. FIGS. 3A to 3D are diagrams illustrating a lead frame in a first example. FIGS. 4A to 4D are diagrams illustrating a lead frame in a second example. FIGS. 5A to 5D are diagrams illustrating a lead frame in a third example. FIGS. 6A to 6D are diagrams illustrating a lead frame in a fourth example. FIGS. 7A to 7D are diagrams illustrating a lead frame in a fifth example. FIGS. 8A to 8D are diagrams illustrating a lead frame in a sixth example. FIGS. 9A to 9D are diagrams illustrating a lead frame in a seventh example. FIGS. 10A to 10D are diagrams illustrating a lead frame in an eighth example. FIGS. 11A to 11D are diagrams illustrating a lead frame in a ninth example.

In FIG. 1 to FIG. 11D, a longitudinal direction of a semiconductor apparatus 1 or a lead frame 2, a direction perpendicular to the longitudinal direction of the semiconductor apparatus 1 or the lead frame 2, and a height (thickness) direction of the semiconductor apparatus 1 or the lead frame 2 are respectively set to an x-direction, a y-direction, and a z-direction. The x-direction, the y-direction, and the z-direction constitute a right-handed orthogonal coordinate system. In some cases, the x-direction, the y-direction, and the z-direction may be respectively referred to as a left-right direction, a front-rear direction, and an up-down direction. The directions (left-right, front-rear, and up-down directions) are respectively phrases used for convenience of illustration, and a correspondence with each of the x-, y-, and z-directions may change depending on an attachment posture of the semiconductor apparatus 1. For example, the base substrate 3 side of the semiconductor apparatus 1 and the opposite side thereof may be respectively referred to as the lower surface side and the upper surface side. In this specification, a plan view means a case where an upper surface or a lower surface of the semiconductor apparatus 1 is viewed in the z-direction. Respective aspect ratios and magnitude relationships among members in FIG. 1 to FIG. 11D do not necessarily match one another because they are merely represented with schematic views. For convenience of illustration, a case where the magnitude relationship among the members is represented in an exaggerated manner is also assumed.

The semiconductor apparatus 1 according to the embodiment is applied to a power conversion apparatus such as an inverter of an industrial motor or an on-vehicle motor, for example. As illustrated in FIG. 1 and FIG. 2, the semiconductor apparatus 1 is configured by arranging a semiconductor device 4 on an upper surface of a base substrate 3 made of copper or the like. A cooler may be arranged on a lower surface of the base substrate 3.

The semiconductor apparatus 1 is configured by arranging an insulating circuit board 6 (a substrate), the semiconductor device 4, the lead frame 2, a wire 7, terminals 8 to 10 and the like in a case 5. In FIG. 1 and FIG. 2, illustration of a part on the front side of the plane of paper of the case 5 is omitted to illustrate a structure in the case 5.

The insulating circuit board 6 is composed of a DCB (direct copper bonding) substrate, an AMB (active metal brazing) substrate, or a metal base substrate, for example. The insulating circuit board 6 is configured by laminating an insulating plate 11, a heat dissipation plate 12, and a plurality of wirings 13 to 15, and is formed into a rectangular shape in a plan view as a whole.

The insulating plate 11 is formed of a plate-shaped body having an upper surface and a lower surface, and has a rectangular shape in a plan view extending in the x-direction. The insulating plate 11 may be formed of a ceramic material such as aluminum nitride (AlN), silicon nitride ($Si_3N_4$), aluminum oxide ($Al_2O_3$), or zirconium oxide ($ZrO_2$).

The insulating plate 11 may be formed of thermosetting resin such as epoxy resin or polyimide resin, or a composite material in which fillers such as glass or ceramic materials have been added to a thermosetting resin, for example. The insulating plate 11 may be preferably formed of a material having flexibility and containing thermosetting resin, for example. The insulating plate 11 may also be referred to as an insulating layer or an insulating film.

The heat dissipation plate 12 has a predetermined thickness in the z-direction, and has a rectangular shape in a plan view extending in the y-direction. The heat dissipation plate 12 is formed of a metal plate having good thermal conductivity such as copper or aluminum, for example. The heat dissipation plate 12 may be subjected to electroless nickel (Ni—P) plating. The heat dissipation plate 12 is arranged on the lower surface of the insulating plate 11. A lower surface of the heat dissipation plate 12 functions as a heat dissipation surface (heat dissipation region) for releasing heat of the semiconductor device 4. The heat dissipation plate 12 is bonded to the upper surface of the base substrate 3 via a bonding material 16 such as a solder. The heat dissipation plate 12 may be arranged on the upper surface of the base substrate 3 via a thermal conductive material such as a thermal grease or a thermal compound.

The wirings 13 to 15 respectively have predetermined thicknesses, and are arranged on the upper surface of the insulating plate 11. The wirings 13 to 15 are respectively formed into island shapes electrically independent of one another. The wirings 13 to 15 each have a rectangular shape in a plan view, and are arranged side by side in the x-direction on the insulating plate 11. The wiring 13 is arranged on the left side of the plane of paper, the wiring 14 is arranged on the right side of the plane of paper, and the wiring 15 is arranged between the wiring 13 and the wiring 14.

The number of wirings is not limited to three, as illustrated in FIG. 1, but is appropriately changeable. For example, four or more wirings may be arranged on the upper surface of the insulating plate 11. Respective shapes, arrangement portions, and the like of the wirings are not limited to these, but are appropriately changeable. Each of the wirings is formed of a metal plate having good thermal conductivity and electrical conductivity such as copper or aluminum, for example. Each of the wirings may be referred to as a circuit layer or a circuit pattern.

The terminal 8 is connected to an upper surface of the wiring 13, the terminal 9 is connected to an upper surface of the wiring 14, and the terminal 10 is connected to an upper surface of the wiring 15. Respective upper end portions of the terminals 8 to 10 extend to positions slightly higher than an upper end portion of the case 5. The terminals 8 to 10 may be each obtained by subjecting copper to electroless nickel (Ni—P) plating, for example.

The semiconductor device 4 is arranged on the upper surface of the wiring 15 via a bonding material 17 such as a solder. The bonding material 17 may be a material having conductivity, for example, a solder or a metallic sintered material.

The semiconductor device 4 is formed into a rectangular shape in a plan view by a semiconductor substrate made of silicon (Si) or the like, for example. The semiconductor device 4 may be composed of a wide bandgap semiconductor device (that may be referred to as a wide gap semiconductor device) formed of a wide bandgap semiconductor substrate made of silicon carbide (SiC), gallium nitride (GaN), diamond, or the like in addition to silicon, described above.

In the semiconductor device 4, a switching element such as an IGBT or a MOSFET or a diode such as an FWD may be formed.

In the semiconductor device 4, a combination of a switching element and a diode, described above, may be formed. The number of arrangements of semiconductor devices 4, and a shape, an arrangement portion, and the like of each of the semiconductor devices 4 are appropriately changeable. For example, an inverter circuit may be formed by connecting two RC (reverse conducting)-IGBTs each including a semiconductor device 4 in which an IGBT is formed and a semiconductor device 4 in which an FWD is formed in series with each other.

The semiconductor device 4 thus configured has an upper surface and a lower surface on its xy surface, and electrodes (not illustrated) are respectively formed on the surfaces. For example, a main electrode and a gate electrode are formed on the upper surface of the semiconductor device 4, and a main electrode is also formed on the lower surface of the semiconductor device 4.

If a MOSFET is formed in the semiconductor device 4, for example, the main electrode on the upper surface side may be referred to as a source electrode, and the main electrode on the lower surface side may be referred to as a drain electrode. If an IGBT is formed in the semiconductor device 4, the main electrode on the upper surface side may be referred to as an emitter electrode, and the main electrode on the lower surface side may be referred to as a collector electrode. The gate electrode may be referred to as a gate electrode as it is regardless of the type of the device. An auxiliary electrode may be provided separately from the main electrode on the upper surface of the semiconductor device 4. For example, an auxiliary electrode may be an auxiliary source electrode or an auxiliary emitter electrode to be electrically connected to the main electrode on the upper surface side and serving as a reference potential for a potential of the gate electrode. The electrodes (the main electrode, the gate electrode, and the auxiliary electrode) formed on the upper surface of the semiconductor device 4 may be collectively referred to as an upper surface electrode, and the electrode formed on the lower surface of the semiconductor device 4 may be referred to as a lower surface electrode. The gate electrode and the auxiliary electrode in the upper surface electrode may be each referred to as a control electrode.

In the embodiment, the main electrode is an electrode through which a main current flows, and the gate electrode is an electrode for turning on and off the main current.

In the semiconductor device 4 in the embodiment, a so-called vertical switching element obtained by forming functional elements such as a transistor in a thickness direction on a semiconductor substrate may be formed, or a horizontal switching element obtained by forming the functional elements in a planar direction may be formed.

The upper surface (main electrode) of the semiconductor device 4 and the upper surface of the wiring 14 are electrically connected to each other by the lead frame 2. The lead frame 2 constitutes a main current wiring member, and functions as a part of a path of a main current flowing through the semiconductor apparatus 1 (a main current path).

The lead frame 2 is composed of a plate-shaped body having an upper surface and a lower surface. The thickness of the lead frame 2 may be not less than 0.1 [mm] nor more than 2.5 [mm]. The lead frame 2 is formed of a metal such as copper, a copper alloy, an aluminum alloy, or an iron alloy, for example. The lead frame 2 is formed into a predetermined shape by press working, for example. A shape of the lead frame 2 described below merely represents an example, and is appropriately changeable. The lead frame 2 may be referred to as a metal wiring board.

The lead frame 2 according to the embodiment has an elongated body extending in the x-direction in a plan view, and has a crank shape having a bending portion that has been bent a plurality of times in a side view. Specifically, the lead frame 2 includes a first bonding section 201, a second bonding section 202, and a coupling section 203. The first bonding section 201 is bonded to the upper surface of the semiconductor device 4 via a bonding material 18. The second bonding section 202 is bonded to the upper surface of the wiring 14 via a bonding material 19. The coupling section 203 couples the first bonding section 201 and the second bonding section 202 to each other.

The first bonding section 201 includes a plate-shaped portion having an upper surface and a lower surface on its xy surface and having a thickness in the z-direction. The first bonding section 201 is arranged to oppose the upper surface electrode on the semiconductor device 4, and is bonded thereto via the bonding material 18 in the z-direction. For example, respective lengths in the x-direction and the y-direction of the first bonding section 201 are set to 3.0 [mm].

A first recess 20 recessed toward the semiconductor device 4 is formed on the upper surface of the first bonding section 201. In such a configuration, a projection is formed in a portion corresponding to the first recess 20 on the lower surface of the first bonding section 201. Details of a shape of the first recess 20 will be described below.

One end of the wire 7 is connected to a bottom surface of the first recess 20 by wire bonding using an ultrasonic wave or the like. The other end of the wire 7 is connected to the upper surface of the wiring 13 by wire bonding using a ultrasonic wave or the like. The one end of the wire 7 is connected to the bottom surface of the first recess 20 by wire bonding. Accordingly, the respective lengths in the x-direction and the y-direction of the first recess 20 are each set to such a length that a distal end of a bonding tool (capillary) that is operating does not interfere with a side surface of the first recess 20. If the larger the diameter of the wire 7 is, the larger the distal end of the bonding tool becomes, for example, the larger the diameter of the wire 7 becomes, the larger the respective lengths in the x-direction and the y-direction of the first recess 20 are made. The upper surface of the semiconductor device 4 and the wiring 13 are electrically connected to each other via the first bonding section 201 in the lead frame 2 and the wire 7. Accordingly, a voltage between the gate and the emitter of an IGBT formed in the semiconductor device 4 can be taken out of the semiconductor apparatus 1 via the first bonding section 201, the wire 7, the wiring 13, and the terminal 8.

A plurality of bosses protruding toward the semiconductor device 4 may be formed on the lower surface of the first bonding section 201. In such a configuration, a recess is formed in a portion corresponding to a position just above each of the bosses on the upper surface of the first bonding section 201.

The second bonding section 202 includes a plate-shaped portion having an upper surface and a lower surface on its xy surface and having a thickness in the z-direction. The second bonding section 202 is arranged to oppose the wiring 14 and is bonded thereto via the bonding material 19 in the z-direction.

A plurality of bosses protruding toward the wiring 14 may be formed on the lower surface of the second bonding section 202. In such a configuration, a recess is formed in a portion corresponding to a position just above each of the bosses on the upper surface of the second bonding section 202.

One end of the coupling section 203 is connected to the first bonding section 201, and the other end of the coupling section 203 is connected to the second bonding section 202. That is, the coupling section 203 electrically bonds the first bonding section 201 and the second bonding section 202 to each other.

The width in the y-direction of the lead frame 2 thus configured is uniform from the first bonding section 201 to the second bonding section 202. The thickness of the lead frame 2 is uniform from the first bonding section 201 to the second bonding section 202. The first bonding section 201, the second bonding section 202, and the coupling section 203 are arranged side by side in a row along the x-direction in a plan view. The width in the y-direction of the lead frame 2 need not be uniform but may vary from the first bonding section 201 to the second bonding section 202. The thickness of the lead frame 2 need not be uniform but may be partially thin from the first bonding section 201 to the second bonding section 202. The first bonding section 201, the second bonding section 202, and the coupling section 203 need not be arranged side by side in a row but may be arranged to diagonally shift from one another.

The number of lead frames 2, described above, and a shape, an arrangement portion, and the like of each of the lead frames 2 are merely examples, and are not limitations, but are appropriately changeable. A plurality of lead frames 2 may be arranged for each semiconductor apparatus 1, for example.

The insulating circuit board 6, the semiconductor device 4, the lead frame 2, the wire 7, and the terminals 8 to 10 are surrounded by the case 5. The case 5 has a cylindrical shape or a frame shape having a square annular shape in a plan view, and is formed of synthetic resin, for example. The case 5 may be formed of a thermosetting resin material such as epoxy resin or silicone rubber, for example. The case 5 has its lower end adhering to the upper surface of the base substrate 3 via an adhesive (not illustrated) and has its upper end extending to a sufficiently higher position than that of an upper end portion of the lead frame 2 (an upper surface of the coupling section 203). As a result, the case 5 surrounds the insulating circuit board 6, the semiconductor device 4, the lead frame 2, the wire 7, and the terminals 8 to 10, and defines a space accommodating the insulating circuit board 6, the semiconductor device 4, the lead frame 2, the wire 7, and the terminals 8 to 10.

An internal space defined by the case 5 is filled with solid resin R (resin). The internal space may be filled with the solid resin R such that an upper surface of the solid resin R reaches the upper end of the case 5. As a result, the insulating circuit board 6, the semiconductor device 4, the lead frame 2, the wire 7, and the terminals 8 to 10 are sealed. The entire lead frame 2 is covered with the solid resin R.

The solid resin R may be composed of thermosetting resin, for example. The solid resin R preferably contains at least any of epoxy, silicon, urethane, polyimide, polyamide, and polyamide-imide. Epoxy resin into which a filler is mixed, for example, is preferable as the solid resin R in terms of insulation, heat resistance, and heat dissipation.

When the semiconductor apparatus 1 is subjected to a power cycle test, and is operated until it fails, a connection failure between the lead frame 2 (the first bonding section 201) and one end of the wire 7 occurs as one of failures. As a factor by which the failure occurs, the following event, for example, is considered.

The solid resin R such as epoxy-based resin has a relatively large modulus of elasticity and is hard. Accordingly, when the linear expansion coefficient of the solid resin R and the linear expansion coefficient of the lead frame 2 differ from each other, a stress occurs in a bonding interface between the solid resin R and the lead frame 2 as respective temperatures of the solid resin R and the lead frame 2 rise due to heat generation of the semiconductor device 4. Due to the stress, the wire 7 may be cracked or disconnected. Therefore, to suppress a connection failure between the lead frame 2 and the wire 7, an interface between the lead frame 2 and the solid resin R needs to be prevented from being peeled.

In the semiconductor apparatus 1 according to the embodiment, the first recess 20 is formed on the upper surface of the lead frame 2 (the first bonding section 201), and is connected to the one end of the wire 7 on the bottom surface of the first recess 20. For example, the length in the z-direction of the first recess 20 (the depth of the first recess 20) is set to 0.1 to 0.5 [mm].

As a result, the surface area of the upper surface of the lead frame 2 can be made wider by an amount corresponding to the side surface of the first recess 20 than when the first recess 20 is not formed on the upper surface of the lead frame 2 (the first bonding section 201). Accordingly, the surface area of the lead frame 2 around a connection portion between the lead frame 2 and the wire 7 can be increased. Therefore, a heat dissipation effect around the connection portion between the lead frame 2 and the wire 7 can be enhanced. Accordingly, a stress occurring in the bonding interface between the solid resin R and the lead frame 2 can be relaxed as the respective temperatures of the solid resin R and the lead frame 2 rise due to heat generation of the semiconductor device 4. Therefore, the interface between the lead frame 2 and the solid resin R can be prevented from being peeled, and the connection failure between the lead frame 2 and the wire 7 can be suppressed.

The first recess 20 is formed on the upper surface of the lead frame 2. Accordingly, a contact area between the solid resin R and the lead frame 2 can be increased, and an adhesive force between the solid resin R and the lead frame 2 can be increased. Even if a stress occurs in the bonding interface between the solid resin R and the lead frame 2 as the respective temperatures of the solid resin R and the lead frame 2 rise due to heat generation of the semiconductor device 4, the interface between the lead frame 2 and the solid resin R can be prevented from being peeled, and the connection failure between the lead frame 2 and the wire 7 can be suppressed. The larger the bottom portion of the first recess 20 (the area in a plan view of the first recess 20) is, the larger the side surface of the first recess 20 becomes so that the larger an adhesive force between the solid resin R and the first recess 20 can be. However, the size of the bottom portion of the first recess 20 is set in consideration of not only the adhesive force between the solid resin R and the first recess 20 but also prevention of interference between the side surface of the first recess 20 and the bonding tool.

A shape of the lead frame 2 (the first bonding section 201) according to the embodiment will be described below.

First Example

Figure 3A:
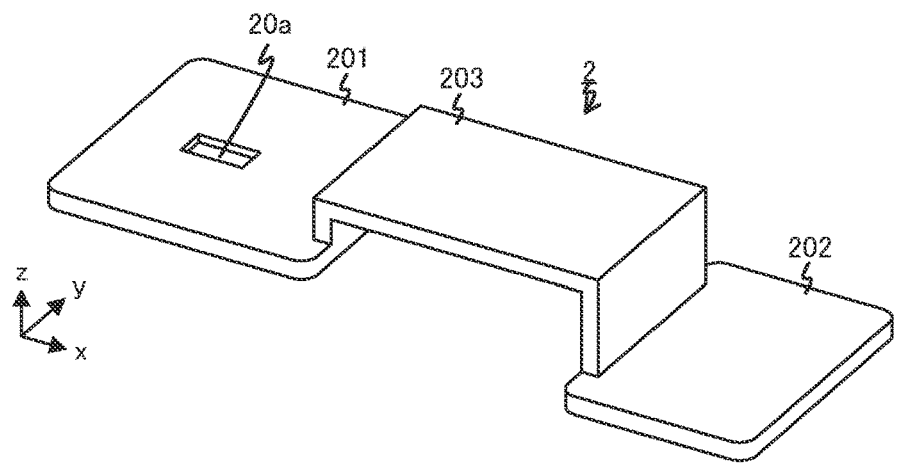
FIGS. 3A to 3D are diagrams illustrating a lead frame in a first example.
Figure 3B:
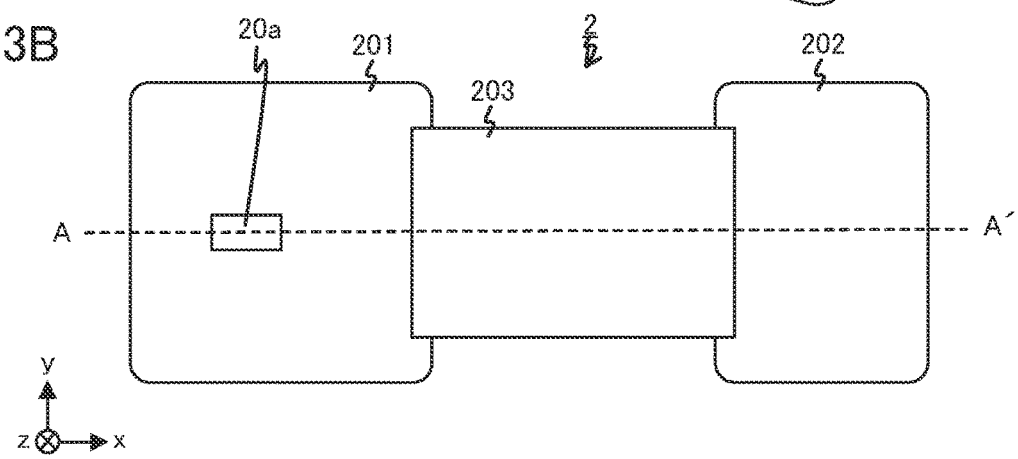
Figure 3C:
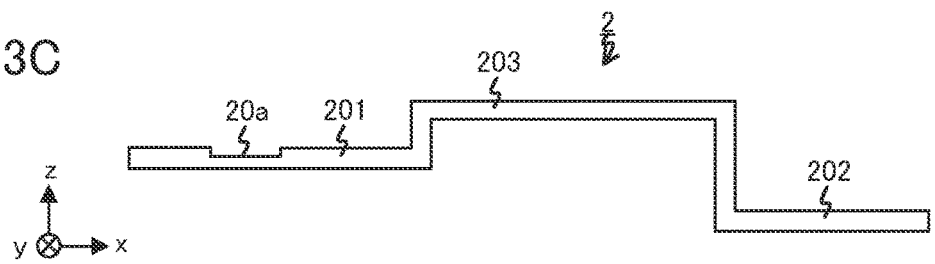
Figure 3D:
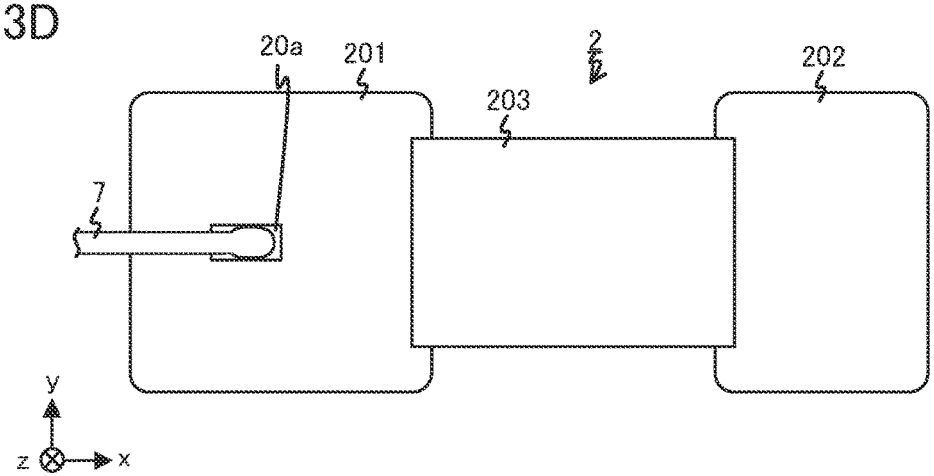

FIG. 3A is a perspective view of a lead frame 2 in a first example. FIG. 3B is a plan view of the lead frame 2 illustrated in FIG. 3A as viewed from the front side toward the rear side of a plane of paper in the z-direction. FIG. 3C is a cross-sectional view taken along a line A-A' of the lead frame 2 illustrated in FIG. 3B. FIG. 3D is a plan view in a case where one end of a wire 7 is connected to a bottom surface of a first recess 20a in the lead frame 2 illustrated in FIG. 3B.

In the lead frame 2 illustrated in FIG. 3A to FIG. 3C, a first recess 20a having a rectangular parallelepiped shape is formed in the vicinity of the center on an upper surface of a first bonding section 201. The first recess 20a is formed by being recessed from the upper surface side of the first bonding section 201 by press working or the like. The length in the x-direction, the length in the y-direction, and the length in the z-direction of the first recess 20a are respectively set to 1 [mm], 0.4 [mm], and 0.5 [mm].

In the lead frame 2 illustrated in FIG. 3D, the one end of the wire 7 is connected to the bottom surface of the first recess 20a by wire bonding. When the one end of the wire 7 collapses to expand in an elliptical shape at the time of connection, the wire 7 may be connected to the lead frame 2 such that the one end of the wire 7 is connected to not only the bottom surface of the first recess 20a but also a side surface in the x-direction (longitudinal direction) of the first recess 20a.

When the first recess 20a is thus formed on an upper surface of the lead frame 2, and the one end of the wire 7 is connected to the bottom surface of the first recess 20a, heat can be dissipated from not only the bottom surface but also the side surface of the first recess 20a. Accordingly, a rise in temperature in the vicinity of a connection portion between the lead frame 2 and the wire 7 can be reduced. As a result, an adhesive force between solid resin R and the upper surface of the lead frame 2 can be prevented from decreasing. Accordingly, an interface between the lead frame 2 and the solid resin R can be prevented from being peeled, and a connection failure between the lead frame 2 and the wire 7 can be suppressed.

The solid resin R can be brought into contact with not only the bottom surface of the first recess 20a but also the side surface of the first recess 20a. Accordingly, an adhesive force between the solid resin R and the upper surface of the lead frame 2 can be increased. As a result, the interface between the lead frame 2 and the solid resin R can be prevented from being peeled, and the connection failure between the lead frame 2 and the wire 7 can be suppressed.

When the one end of the wire 7 is connected to not only the bottom surface of the first recess 20a but also the side surface thereof in the x-direction, a connection strength between the lead frame 2 and the wire 7 can be increased. Accordingly, the connection failure between the lead frame 2 and the wire 7 can be further suppressed.

Second Example

Figure 4A:
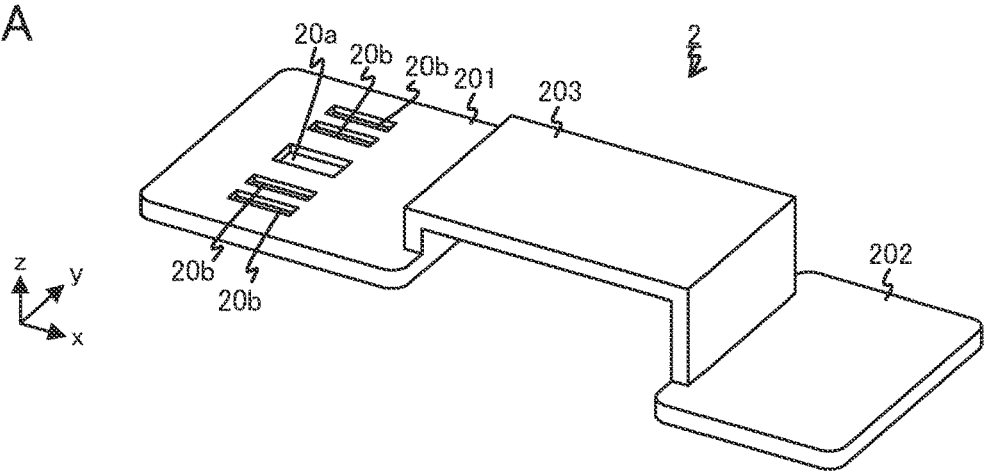
FIGS. 4A to 4D are diagrams illustrating a lead frame in a second example.
Figure 4B:
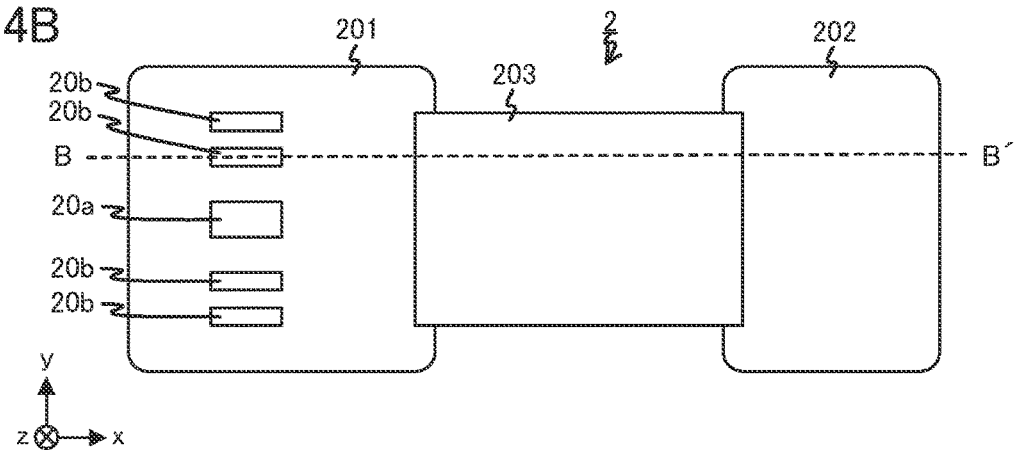
Figure 4C:
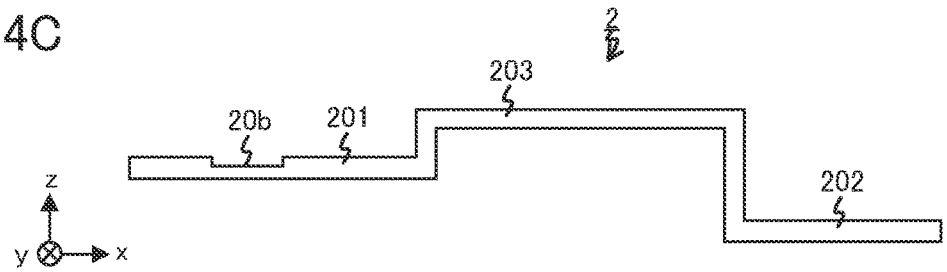
Figure 4D:
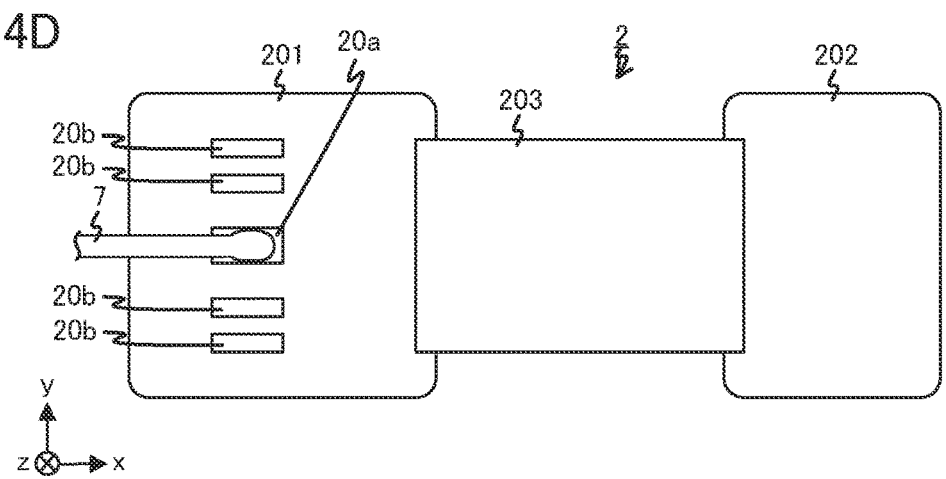

FIG. 4A is a perspective view of a lead frame 2 in a second example. FIG. 4B is a plan view of the lead frame 2 illustrated in FIG. 4A as viewed from the front side toward the rear side of a plane of paper in the z-direction. FIG. 4C is a cross-sectional view taken along a line B-B' of the lead frame 2 illustrated in FIG. 4B. FIG. 4D is a plan view in a case where one end of a wire 7 is connected to a bottom surface of a first recess 20a in the lead frame 2 illustrated in FIG. 4B. In FIGS. 4A to 4D, the same components as the components illustrated in FIGS. 3A to 3D are assigned the same reference numerals, and hence description thereof is omitted.

The lead frame 2 illustrated in FIG. 4A to FIG. 4C differs from the lead frame 2 illustrated in FIG. 3A to FIG. 3C in that two second recesses 20b each having a rectangular parallelepiped shape are formed on each of both sides in the y-direction of the first recess 20a. The first recess 20a and the four second recesses 20b are formed side by side in the y-direction. Each of the second recesses 20b is formed by being recessed from the upper surface side of a first bonding section 201 by press working or the like. The length in the x-direction, the length in the y-direction, and the length in the z-direction of the second recess 20b are respectively set to 1 [mm], 0.4 [mm], and 0.5 [mm].

In the lead frame 2 illustrated in FIG. 4D, the one end of the wire 7 is connected to the bottom surface of the first recess 20a by wire bonding. When the one end of the wire 7 collapses to expand in an elliptical shape at the time of connection, the wire 7 may be connected to the lead frame 2 such that the one end of the wire 7 is connected to not only the bottom surface of the first recess 20a but also a side surface in the x-direction (longitudinal direction) of the first recess 20a. That is, the first recess 20a is formed for connection to the wire 7 and heat dissipation, and each of the second recesses 20b is formed for only heat dissipation.

When the plurality of second recesses 20b is thus formed in addition to the first recess 20a on an upper surface of the lead frame 2, heat can be dissipated from not only the side surface of the first recess 20a but also a side surface of each of the second recesses 20b. Accordingly, a rise in temperature in the vicinity of a connection portion between the lead frame 2 and the wire 7 can be further reduced. As a result, an adhesive force between solid resin R and the upper surface of the lead frame 2 can be further prevented from decreasing. Accordingly, an interface between the lead frame 2 and the solid resin R can be further prevented from being peeled, and a connection failure between the lead frame 2 and the wire 7 can be further suppressed.

The solid resin R can be brought into contact with not only the side surface of the first recess 20a but also the side surface of the second recesses 20b. Accordingly, the adhesive force between the solid resin R and the upper surface of the lead frame 2 can be further increased. As a result, the interface between the lead frame 2 and the solid resin R can be further prevented from being peeled, and the connection failure between the lead frame 2 and the wire 7 can be further suppressed.

When the one end of the wire 7 is connected to not only the bottom surface of the first recess 20a but also the side surface thereof in the x-direction, a connection strength between the lead frame 2 and the wire 7 can be increased. Accordingly, the connection failure between the lead frame 2 and the wire 7 can be further suppressed.

Third Example

Figure 5A:
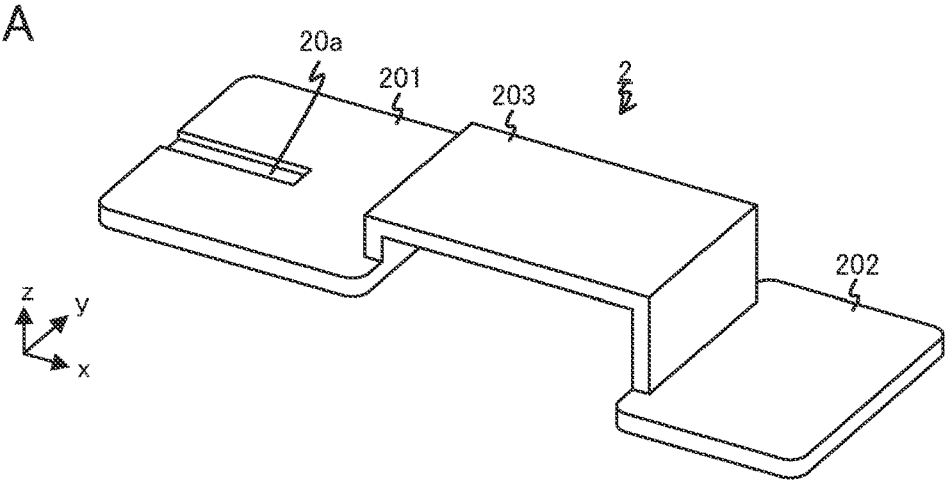
FIGS. 5A to 5D are diagrams illustrating a lead frame in a third example.
Figure 5B:
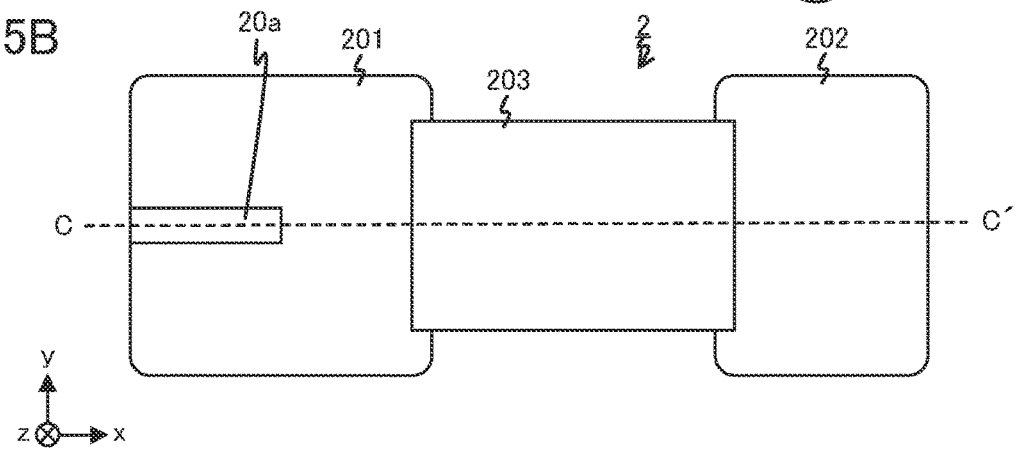
Figure 5C:
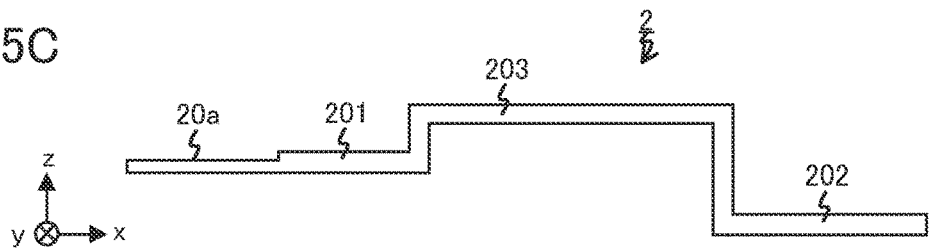
Figure 5D:
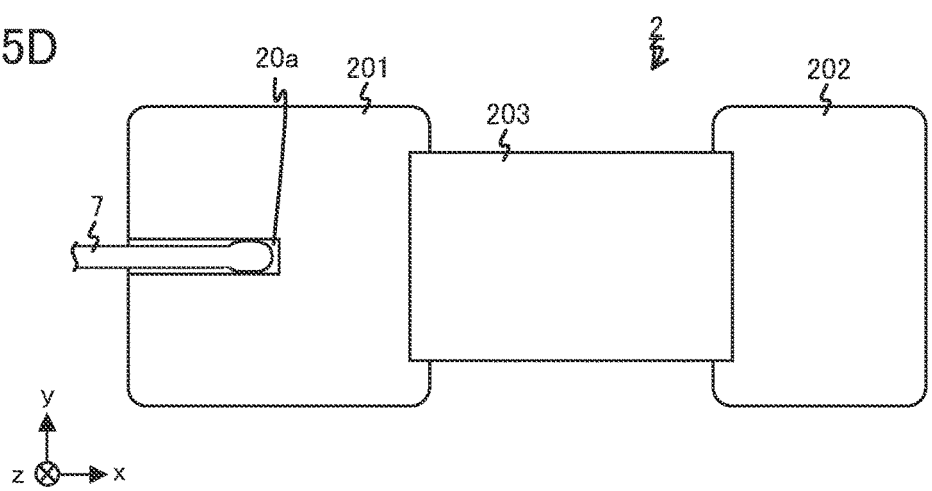

FIG. 5A is a perspective view of a lead frame 2 in a third example. FIG. 5B is a plan view of the lead frame 2 illustrated in FIG. 5A as viewed from the front side toward the rear side of a plane of paper in the z-direction. FIG. 5C is a cross-sectional view taken along a line C-C' of the lead frame 2 illustrated in FIG. 5B. FIG. 5D is a plan view in a case where one end of a wire 7 is connected to a bottom surface of a first recess 20a in the lead frame 2 illustrated in FIG. 5B.

The lead frame 2 illustrated in FIG. 5A to FIG. 5C differs from the lead frame 2 illustrated in FIG. 3A to FIG. 3C in that the first recess 20a is formed to extend to an end portion on the negative side in the x-direction of a first bonding section 201. That is, one of two sides in a direction perpendicular to a longitudinal direction of the first recess 20a is positioned in a central portion of the first bonding section 201, and the other side is positioned in the end portion on the negative side in the x-direction of the first bonding section 201. The first recess 20a is formed by being recessed from the upper surface side of the first bonding section 201 by press working or the like. The length in the x-direction, the length in the y-direction, and the length in the z-direction of the first recess 20a are respectively set to 1.5 [mm], 0.4 [mm], and 0.5 [mm].

In the lead frame 2 illustrated in FIG. 5D, the one end of the wire 7 is connected to the bottom surface of the first recess 20a by wire bonding. When the one end of the wire 7 collapses to expand in an elliptical shape at the time of connection, the wire 7 may be connected to the lead frame 2 such that the one end of the wire 7 is connected to not only the bottom surface of the first recess 20a but also a side surface in the x-direction (longitudinal direction) of the first recess 20a.

When the first recess 20a is thus formed on an upper surface of the lead frame 2, the side surface of the first recess 20a can be further increased. Accordingly, an amount of heat dissipation from the side surface of the first recess 20a can be further increased, and a rise in temperature in the vicinity of a connection portion between the lead frame 2 and the wire 7 can be further reduced. As a result, an adhesive force between solid resin R and the upper surface of the lead frame 2 can be further prevented from decreasing. Accordingly, an interface between the lead frame 2 and the solid resin R can be further prevented from being peeled, and a connection failure between the lead frame 2 and the wire 7 can be further suppressed.

The side surface of the first recess 20a can be further increased. Accordingly, a contact area between the solid resin R and the lead frame 2 can further increased, and the adhesive force between the solid resin R and the upper surface of the lead frame 2 can be further increased. As a result, the interface between the lead frame 2 and the solid resin R can be further prevented from being peeled, and the connection failure between the lead frame 2 and the wire 7 can be further suppressed.

When the one end of the wire 7 is connected to not only the bottom surface of the first recess 20a but also the side surface thereof in the x-direction, a connection strength between the lead frame 2 and the wire 7 can be increased. Accordingly, the connection failure between the lead frame 2 and the wire 7 can be further suppressed.

Fourth Example

Figure 6A:
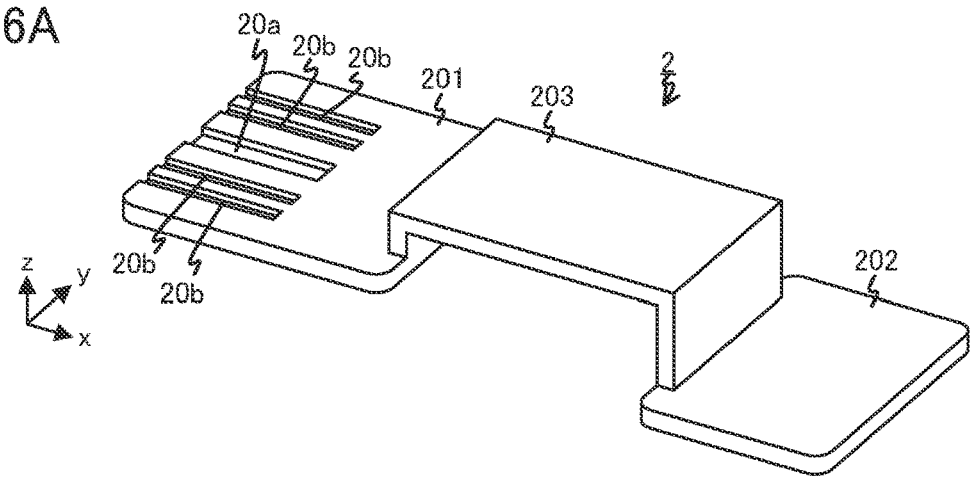
FIGS. 6A to 6D are diagrams illustrating a lead frame in a fourth example.
Figure 6B:
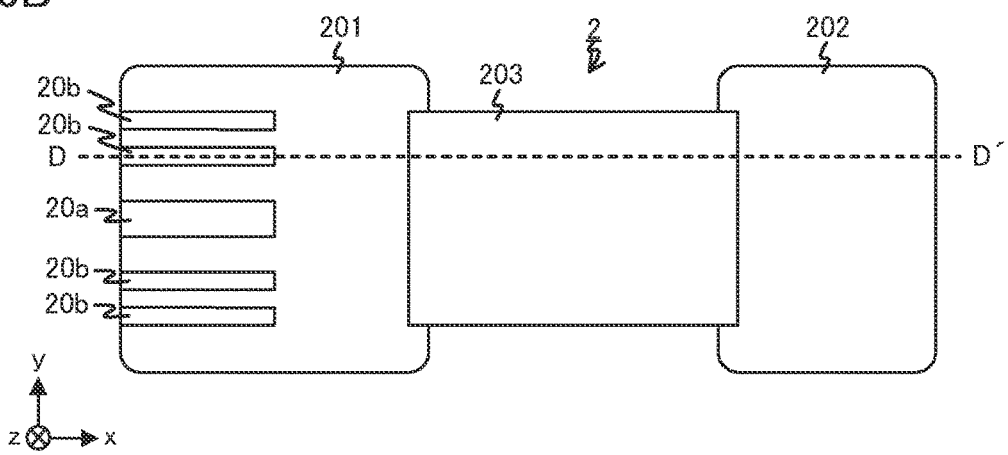
Figure 6C:
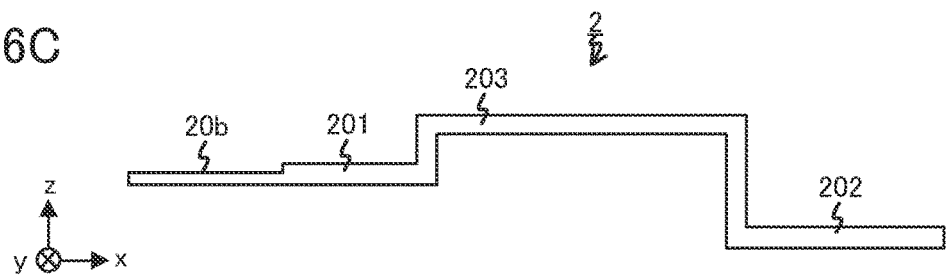
Figure 6D:
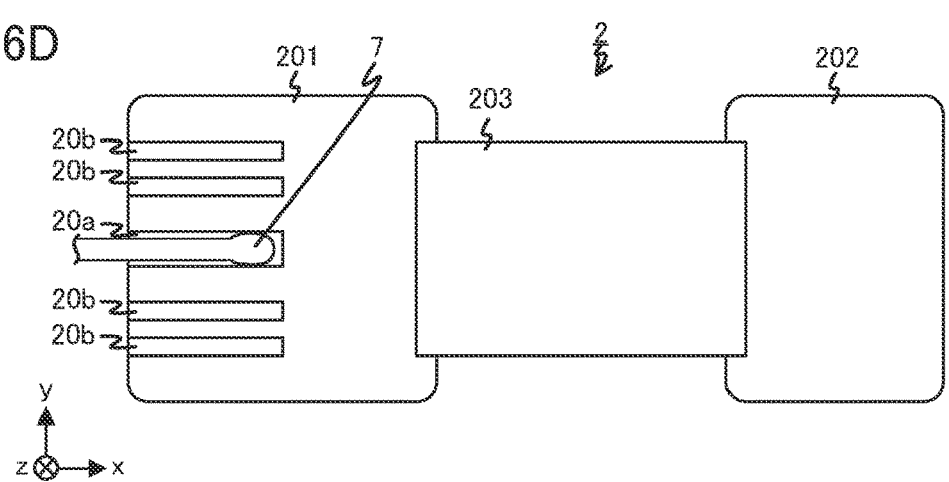

FIG. 6A is a perspective view of a lead frame 2 in a fourth example. FIG. 6B is a plan view of the lead frame 2 illustrated in FIG. 6A as viewed from the front side toward the rear side of a plane of paper in the z-direction. FIG. 6C is a cross-sectional view taken along a line D-D' of the lead frame 2 illustrated in FIG. 6B. FIG. 6D is a plan view in a case where one end of a wire 7 is connected to a bottom surface of a first recess 20a in the lead frame 2 illustrated in FIG. 6B.

The lead frame 2 illustrated in FIG. 6A to FIG. 6C differs from the lead frame 2 illustrated in FIG. 4A to FIG. 4C in that the first recess 20a is formed to extend to an end portion on the negative side in the x-direction of a first bonding section 201 and in that each of second recesses 20b is formed to extend to the end portion on the negative side in the x-direction of the first bonding section 201. That is, one of two sides in a direction perpendicular to a longitudinal direction of the first recess 20a is positioned in a central portion of the first bonding section 201, and the other side is positioned in an end portion on the negative side in the x-direction of the first bonding section 201. One of two sides in a direction perpendicular to a longitudinal direction of each of the second recesses 20b is positioned in the central portion of the first bonding section 201, and the other side is positioned in the end portion on the negative side in the x-direction of the first bonding section 201. The first recess 20a and each of the second recesses 20b are formed by being recessed from the upper surface side of the first bonding section 201 by press working or the like. The length in the x-direction, the length in the y-direction, and the length in the z-direction of each of the first recess 20a and the second recesses 20b are respectively set to 1.5 [mm], 0.4 [mm], and 0.5 [mm].

In the lead frame 2 illustrated in FIG. 6D, the one end of the wire 7 is connected to the bottom surface of the first recess 20a by wire bonding. When the one end of the wire 7 collapses to expand in an elliptical shape at the time of connection, the wire 7 may be connected to the lead frame 2 such that the one end of the wire 7 is connected to not only the bottom surface of the first recess 20a but also a side surface in the x-direction (longitudinal direction) of the first recess 20a. That is, the first recess 20a is formed for connection to the wire 7 and heat dissipation, and each of the second recesses 20b is formed for only heat dissipation.

When the first recess 20a and the second recesses 20b are thus formed on an upper surface of the lead frame 2, the side surface of the first recess 20a can be further increased, and a side surface of each of the second recesses 20b can be further increased. Accordingly, respective amounts of heat dissipation from the first recess 20a and each of the second recesses 20b can be further increased, and a rise in temperature in the vicinity of a connection portion between the lead frame 2 and the wire 7 can be further reduced. As a result, an adhesive force between solid resin R and the upper surface of the lead frame 2 can be further prevented from decreasing. Accordingly, an interface between the lead frame 2 and the solid resin R can be further prevented from being peeled, and a connection failure between the lead frame 2 and the wire 7 can be further suppressed.

The respective side surfaces of the first recess 20 and each of the second recesses 20b can be further increased. Accordingly, a contact area between the solid resin R and the lead frame 2 can further increased, and the adhesive force between the solid resin R and the upper surface of the lead frame 2 can be further increased. As a result, the interface between the lead frame 2 and the solid resin R can be further prevented from being peeled, and the connection failure between the lead frame 2 and the wire 7 can be further suppressed.

When the one end of the wire 7 is connected to not only the bottom surface of the first recess 20a but also the side surface thereof in the x-direction, a connection strength between the lead frame 2 and the wire 7 can be increased. Accordingly, the connection failure between the lead frame 2 and the wire 7 can be further suppressed.

Fifth Example

Figure 7A:
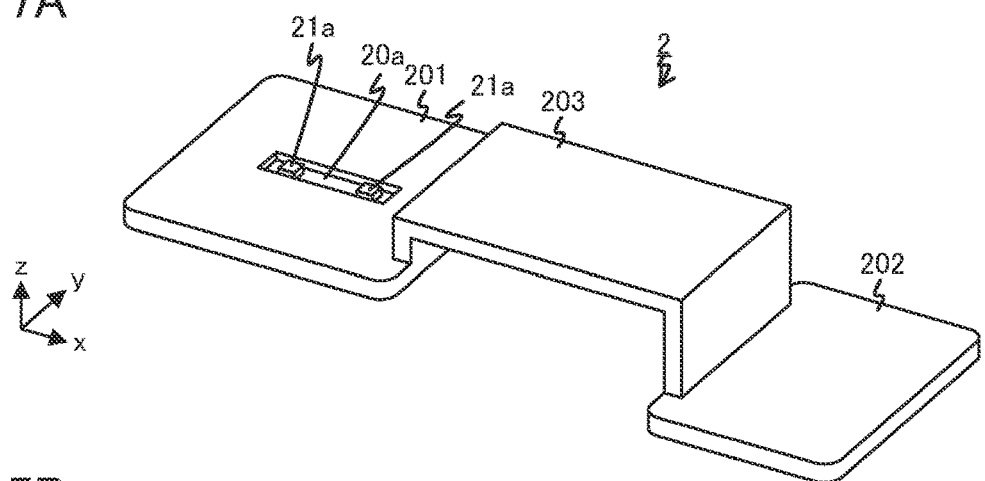
FIGS. 7A to 7D are diagrams illustrating a lead frame in a fifth example.
Figure 7B:
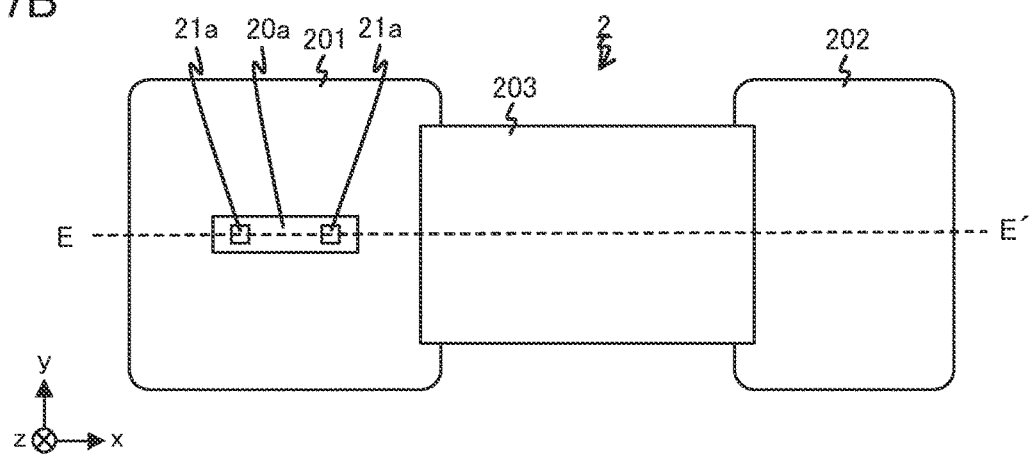
Figure 7C:
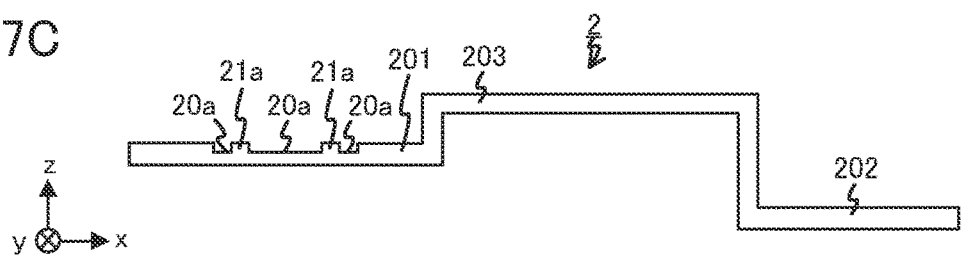
Figure 7D:
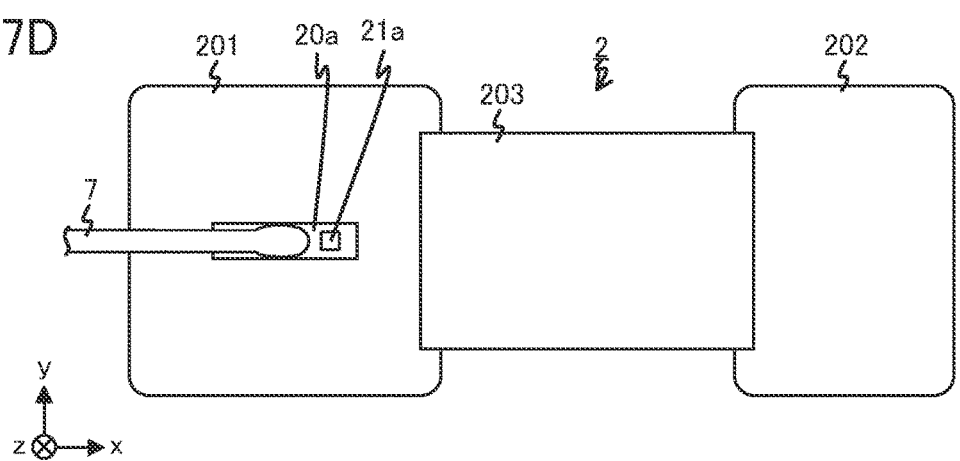

FIG. 7A is a perspective view of a lead frame 2 in a fifth example. FIG. 7B is a plan view of the lead frame 2 illustrated in FIG. 7A as viewed from the front side toward the rear side of a plane of paper in the z-direction. FIG. 7C is a cross-sectional view taken along a line E-E' of the lead frame 2 illustrated in FIG. 7B. FIG. 7D is a plan view in a case where one end of a wire 7 is connected to a bottom surface of a first recess 20a in the lead frame 2 illustrated in FIG. 7B.

The lead frame 2 illustrated in FIG. 7A to FIG. 7C differs from the lead frame 2 illustrated in FIG. 3A to FIG. 3C in that two first projections 21a each having a rectangular parallelepiped shape are formed on the bottom surface of the first recess 20a. The two first projections 21a are respectively formed on both sides of a portion to which the wire 7 is connected. That is, the first projections 21a are formed side by side in the x-direction away from each other by a predetermined distance on the bottom surface of the first recess 20a. The first recess 20a is formed by being recessed from the upper surface side of a first bonding section 201 by press working or the like. Each of the first projections 21a is formed by being recessed from the lower surface side of the first bonding section 201 (the first recess 20a) by press working or the like. The length in the x-direction, the length in the y-direction, and the length in the z-direction of the first recess 20a are respectively set to 2.0 [mm], 0.4 [mm], and 0.5 [mm]. The length in the x-direction, the length in the y-direction, and the length in the z-direction of each of the first projections 21a are respectively set to 0.1 [mm], 0.1 [mm], and 0.1 [mm].

In the lead frame 2 illustrated in FIG. 7D, the one end of the wire 7 is connected to the bottom surface of the first recess 20a by wire bonding. When the one end of the wire 7 collapses to expand in an elliptical shape at the time of connection, the wire 7 may be connected to the lead frame 2 such that the one end of the wire 7 is connected to not only the bottom surface of the first recess 20a but also a side surface in the x-direction (longitudinal direction) of the first recess 20a.

When the first recess 20a and the first projections 21a are thus formed on an upper surface of the lead frame 2, the surface area of the lead frame 2 can be made larger by an amount corresponding to a side surface of each of the first projections 21a than when only the first recess 20a is formed. Accordingly, an amount of heat dissipation in the periphery of a connection portion between the lead frame 2 and the wire 7 can be further increased, and a rise in temperature in the vicinity of the connection portion between the lead frame 2 and the wire 7 can be further reduced. As a result, an adhesive force between solid resin R and the upper surface of the lead frame 2 can be further prevented from decreasing. Accordingly, an interface between the lead frame 2 and the solid resin R can be further prevented from being peeled, and a connection failure between the lead frame 2 and the wire 7 can be further suppressed.

When the first recess 20a and each of the first projections 21a are formed, the surface area of the lead frame 2 can be further made larger than when only the first recess 20a is formed. Accordingly, a contact area between the solid resin R and the lead frame 2 can be further increased, and the adhesive force between the solid resin R and the upper surface of the lead frame 2 can be further increased. As a result, the interface between the lead frame 2 and the solid resin R can be further prevented from being peeled, and the connection failure between the lead frame 2 and the wire 7 can be further suppressed.

When the one end of the wire 7 is connected to not only the bottom surface of the first recess 20a but also the side surface of the first recess 20a, a connection strength between the lead frame 2 and the wire 7 can be increased. Accordingly, the connection failure between the lead frame 2 and the wire 7 can be further suppressed.

When the one end of the wire 7 is connected to not only the bottom surface of the first recess 20a but also the side surface of the first recess 20a, the connection strength between the lead frame 2 and the wire 7 can be further increased. Accordingly, the connection failure between the lead frame 2 and the wire 7 can be further suppressed.

Sixth Example

Figure 8A:
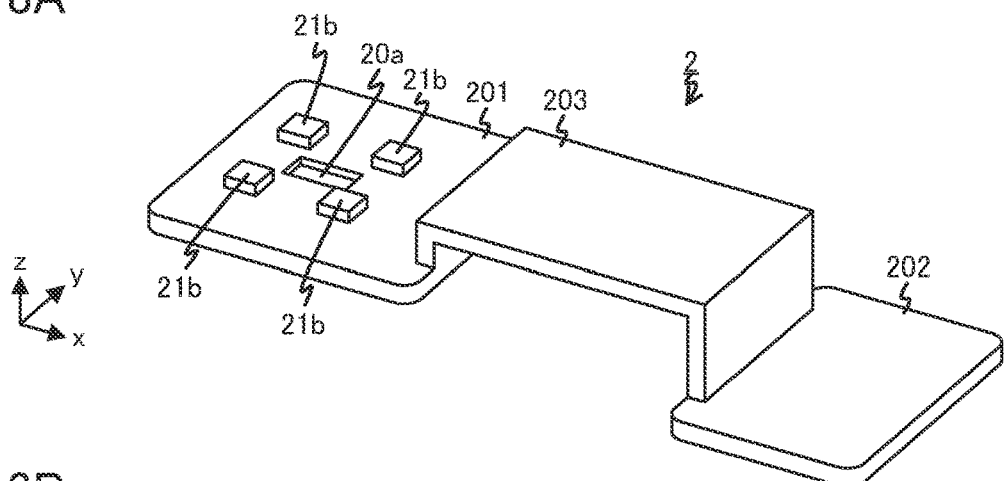
FIGS. 8A to 8D are diagrams illustrating a lead frame in a sixth example.
Figure 8B:
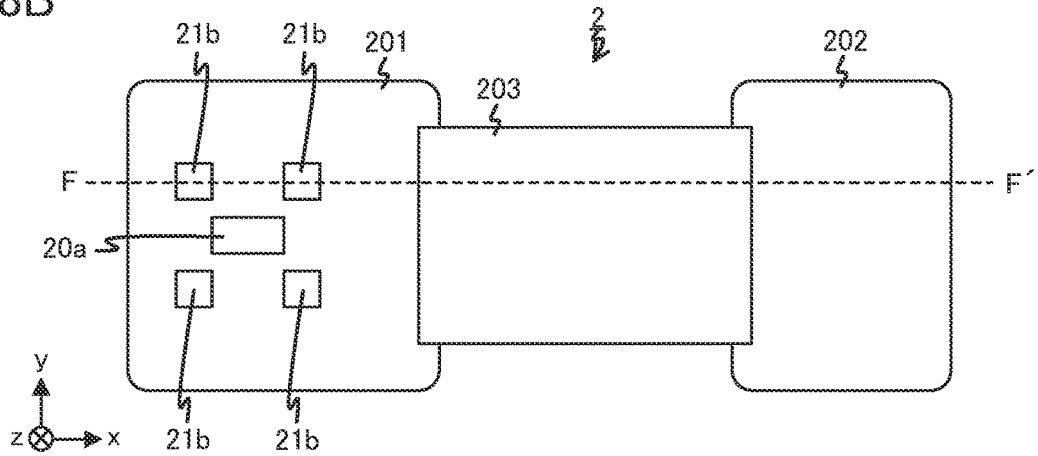
Figure 8C:
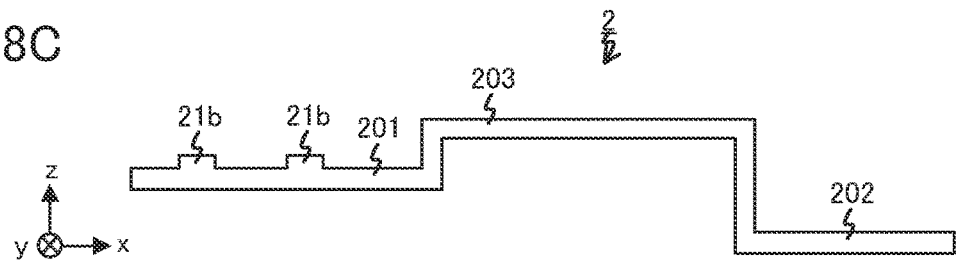
Figure 8D:
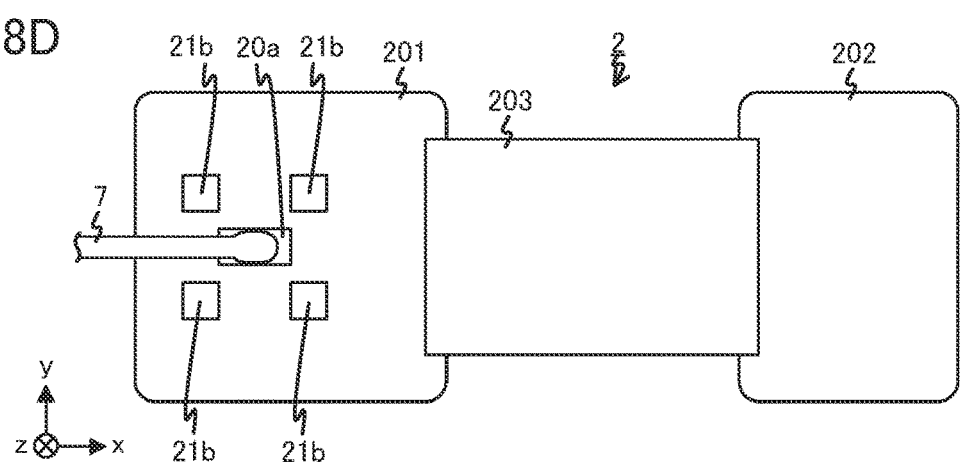

FIG. 8A is a perspective view of a lead frame 2 in a sixth example. FIG. 8B is a plan view of the lead frame 2 illustrated in FIG. 8A as viewed from the front side toward the rear side of a plane of paper in the z-direction. FIG. 8C is a cross-sectional view taken along a line F-F' of the lead frame 2 illustrated in FIG. 8B. FIG. 8D is a plan view in a case where one end of a wire 7 is connected to a bottom surface of a first recess 20a in the lead frame 2 illustrated in FIG. 8B.

The lead frame 2 illustrated in FIG. 8A to FIG. 8C differs from the lead frame 2 illustrated in FIG. 3A to FIG. 3C in that four second projections 21b each having a rectangular parallelepiped shape are formed around the first recess 20a on an upper surface of a first bonding section 201. Each of the second projections 21b are respectively formed in locations near four corners of the first bonding section 201 having a rectangular shape such that their respective positional relationships are symmetrical with the first recess 20a as its center. The first recess 20a is formed by being recessed from the upper surface side of the first bonding section 201 by press working or the like. Each of the second projections 21b is formed by being recessed from the lower surface side of the first bonding section 201 by press working or the like. The length in the x-direction, the length in the y-direction, and the length in the z-direction of the first recess 20a are respectively set to 1.5 [mm], 0.4 [mm], and 0.5 [mm]. The length in the x-direction, the length in the y-direction, and the length in the z-direction of each of the second projections 21b are respectively set to 0.5 [mm], 0.5 [mm], and 0.5 [mm].

In the lead frame 2 illustrated in FIG. 8D, the one end of the wire 7 is connected to the bottom surface of the first recess 20a by wire bonding. When the one end of the wire 7 collapses to expand in an elliptical shape at the time of connection, the wire 7 may be connected to the lead frame 2 such that the one end of the wire 7 is connected to not only the bottom surface of the first recess 20a but also a side surface in the x-direction (longitudinal direction) of the first recess 20a.

When the first recess 20a and each of the second projections 21b are thus formed on an upper surface of the lead frame 2, the surface area of the lead frame 2 can be made larger by an amount corresponding to a side surface of each of the second projections 21b than when only the first recess 20a is formed. Accordingly, an amount of heat dissipation around a connection portion between the lead frame 2 and the wire 7 can be further increased, and a rise in temperature in the vicinity of the connection portion between the lead frame 2 and the wire 7 can be further reduced. As a result, an adhesive force between solid resin R and the upper surface of the lead frame 2 can be further prevented from decreasing. Accordingly, an interface between the lead frame 2 and the solid resin R can be further prevented from being peeled, and a connection failure between the lead frame 2 and the wire 7 can be further suppressed.

When the first recess 20a and each of the second projections 21b are formed, the surface area of the lead frame 2 can be further made larger than when only the first recess 20a is formed. Accordingly, a contact area between the solid resin R and the lead frame 2 can be further increased, and the adhesive force between the solid resin R and the upper surface of the lead frame 2 can be further increased. As a result, an interface between the lead frame 2 and the solid resin R can be further prevented from being peeled, and the connection failure between the lead frame 2 and the wire 7 can be further suppressed.

When the one end of the wire 7 is connected to not only the bottom surface of the first recess 20a but also the side surface of the first recess 20a, a connection strength between the lead frame 2 and the wire 7 can be increased. Accordingly, the connection failure between the lead frame 2 and the wire 7 can be further suppressed.

Seventh Example

Figure 9A:
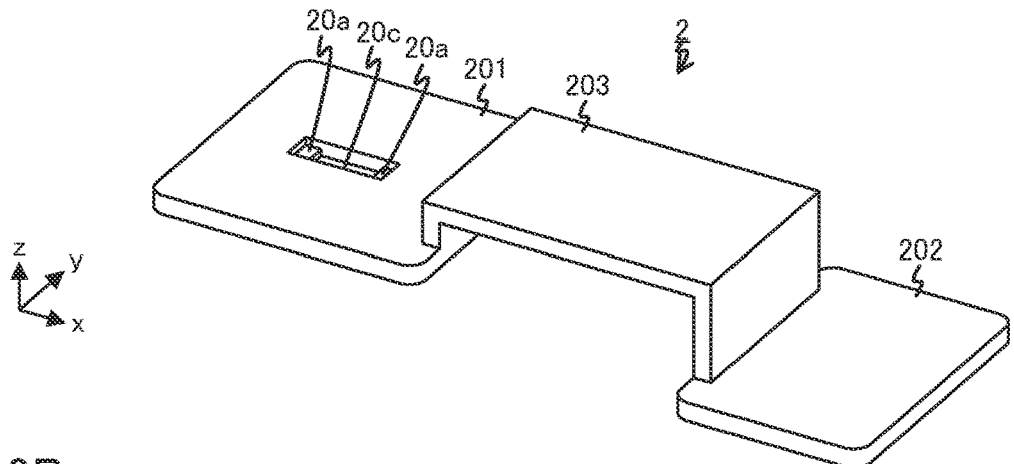
FIGS. 9A to 9D are diagrams illustrating a lead frame in a seventh example.
Figure 9B:
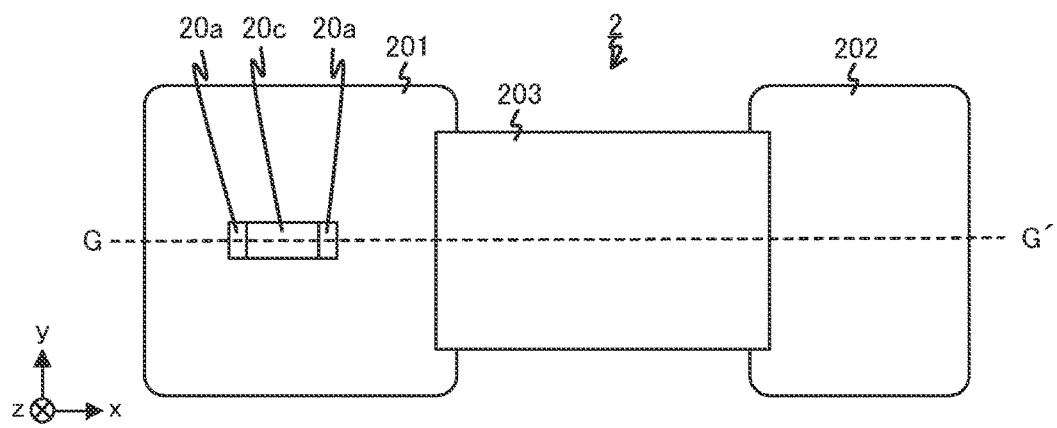
Figure 9C:
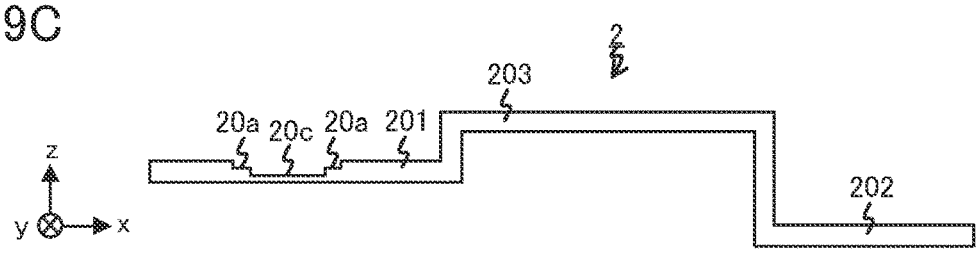
Figure 9D:
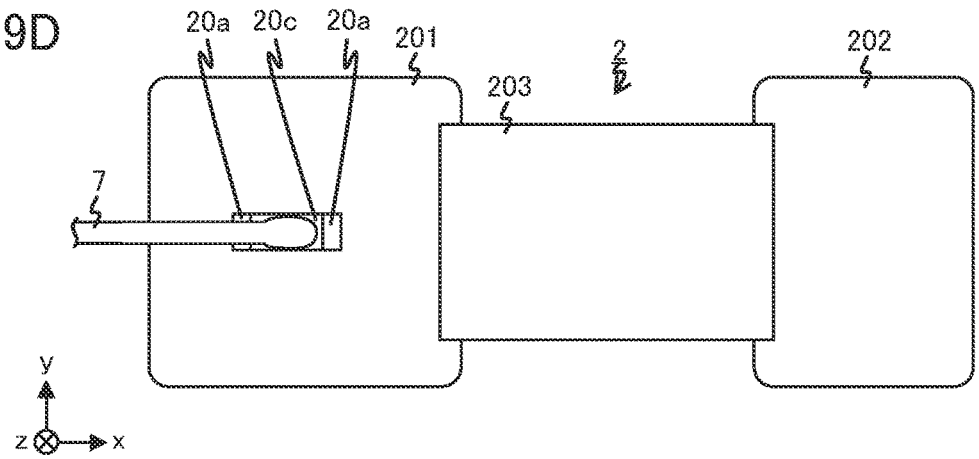

FIG. 9A is a perspective view of a lead frame 2 in a seventh example. FIG. 9B is a plan view of the lead frame 2 illustrated in FIG. 9A as viewed from the front side toward the rear side of a plane of paper in the z-direction. FIG. 9C is a cross-sectional view taken along a line G-G' of the lead frame 2 illustrated in FIG. 9B. FIG. 9D is a plan view in a case where one end of a wire 7 is connected to a bottom surface of a first recess 20c in the lead frame 2 illustrated in FIG. 9B.

The lead frame 2 illustrated in FIG. 9A to FIG. 9C differs from the lead frame 2 illustrated in FIG. 3A to FIG. 3C in that in the vicinity of the center of a bottom portion of a first recess 20a, a first recess 20c (another recess) having a rectangular parallelepiped shape is further formed. The first recess 20a is formed by being recessed from the upper surface side of a first bonding section 201 by press working or the like, and the first recess 20c is formed by further recessing the bottom surface of the first recess 20a toward a semiconductor device 4 by press working or the like. The length in the x-direction, the length in the y-direction, and the length in the z-direction of the first recess 20a are respectively set to 1.5 [mm], 0.4 [mm], and 0.25 [mm]. The length in the x-direction, the length in the y-direction, and the length in the z-direction of the first recess 20c are respectively set to 0.5 [mm], 0.4 [mm], and 0.25 [mm].

In the lead frame 2 illustrated in FIG. 9D, the one end of the wire 7 is connected to the bottom surface of the first recess 20c by wire bonding. When the one end of the wire 7 collapses to expand in an elliptical shape at the time of connection, the wire 7 may be connected to the lead frame 2 such that the one end of the wire 7 is connected to not only the bottom surface of the first recess 20c but also a side surface in the x-direction (longitudinal direction) of the first recess 20c.

When the first recess 20a and the first recess 20c are thus formed on an upper surface of the lead frame 2, the surface area of the lead frame 2 can be made larger by an amount corresponding to the side surface of the first recess 20c than when only the first recess 20a is formed. Accordingly, an amount of heat dissipation in the periphery of a connection portion between the lead frame 2 and the wire 7 can be further increased, and a rise in temperature in the vicinity of the connection portion between the lead frame 2 and the wire 7 can be further reduced. As a result, an adhesive force between solid resin R and the upper surface of the lead frame 2 can be further prevented from decreasing. Accordingly, an interface between the lead frame 2 and the solid resin R can be further prevented from being peeled, and a connection failure between the lead frame 2 and the wire 7 can be further suppressed.

When the first recess 20a and the first recess 20c are formed, the surface area of the lead frame 2 can be further made larger than when only the first recess 20a is formed. Accordingly, a contact area between the solid resin R and the lead frame 2 can be further increased, and the adhesive force between the solid resin R and the upper surface of the lead frame 2 can be further increased. As a result, the interface between the lead frame 2 and the solid resin R can be further prevented from being peeled, and the connection failure between the lead frame 2 and the wire 7 can be further suppressed.

When the one end of the wire 7 is connected to not only the bottom surface of the first recess 20c but also the side surface of the first recess 20c, a connection strength between the lead frame 2 and the wire 7 can be increased. Accordingly, the connection failure between the lead frame 2 and the wire 7 can be further suppressed.

Eighth Example

Figure 10A:
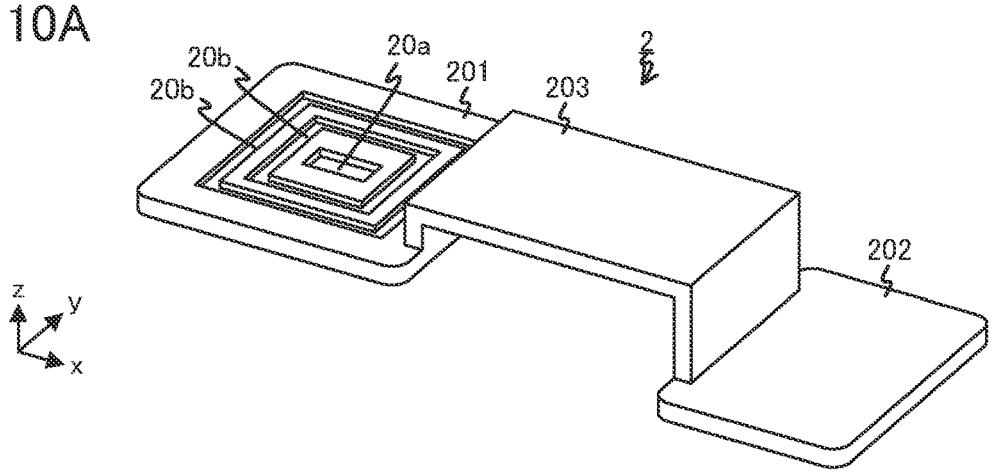
FIGS. 10A to 10D are diagrams illustrating a lead frame in an eighth example.
Figure 10B:
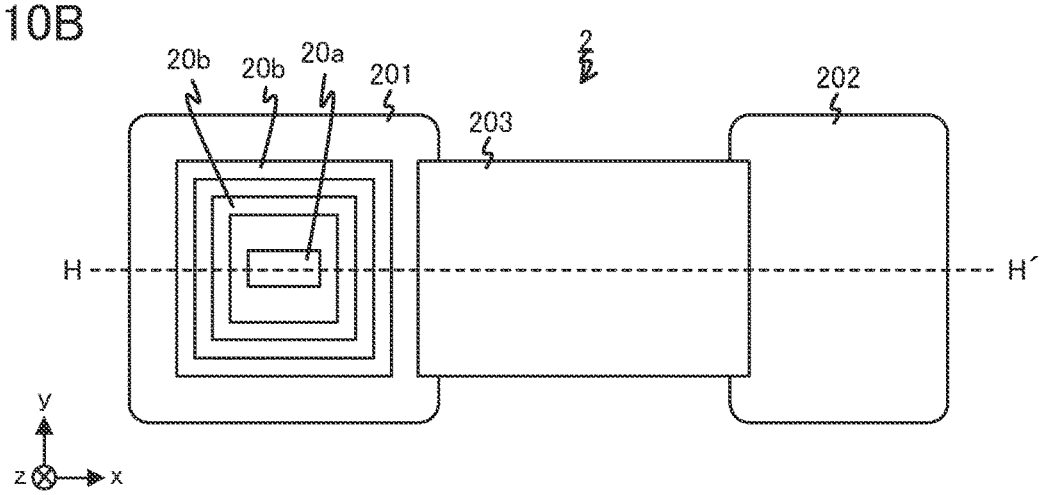
Figure 10C:
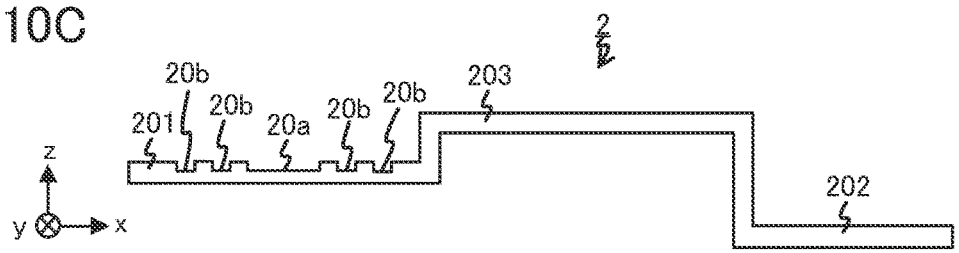
Figure 10D:
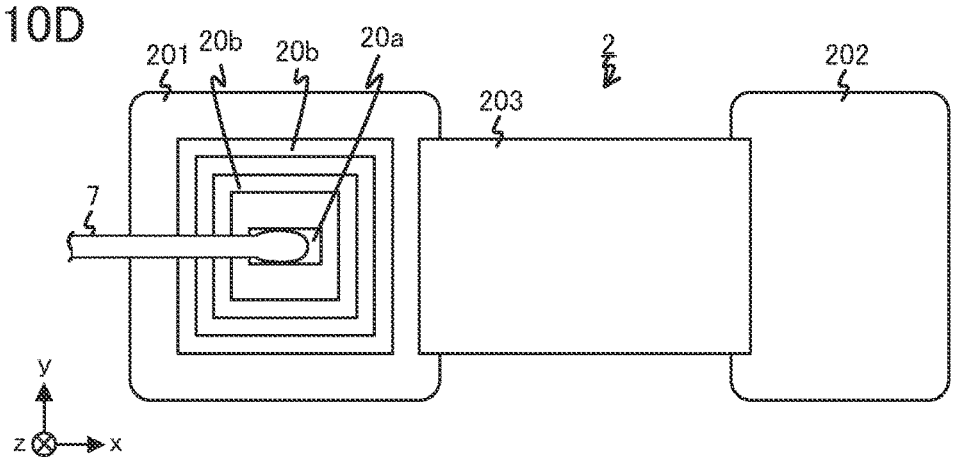

FIG. 10A is a perspective view of a lead frame 2 in an eighth example. FIG. 10B is a plan view of the lead frame 2 illustrated in FIG. 10A as viewed from the front side toward the rear side of a plane of paper in the z-direction. FIG. 10C is a cross-sectional view taken along a line H-H' of the lead frame 2 illustrated in FIG. 10B. FIG. 10D is a plan view in a case where one end of a wire 7 is connected to a bottom surface of a first recess 20a in the lead frame 2 illustrated in FIG. 10B.

The lead frame 2 illustrated in FIG. 10A to FIG. 10C differs from the lead frame 2 illustrated in FIG. 4A to FIG. 4C in that each of second recesses 20b is formed to surround the first recess 20a. That is, each of the second recesses 20b is formed into a shape (an open square shape or a doughnut shape) surrounding the first recess 20a in a substantially square shape in a plan view. The first recess 20a and each of the second recesses 20b are formed by being recessed from the upper surface side of a first bonding section 201 by press working or the like.

In the lead frame 2 illustrated in FIG. 10D, the one end of the wire 7 is connected to the bottom surface of the first recess 20a by wire bonding. When the one end of the wire 7 collapses to expand in an elliptical shape at the time of connection, the wire 7 may be connected to the lead frame 2 such that the one end of the wire 7 is connected to not only the bottom surface of the first recess 20a but also a side surface in the x-direction (longitudinal direction) of the first recess 20a.

When the first recess 20a and each of the second recesses 20b are thus formed on an upper surface of the lead frame 2, a side surface of each of the second recesses 20b can be further increased. Accordingly, an amount of heat dissipation from the side surface of each of the second recesses 20b can be further increased, and a rise in temperature in the vicinity of a connection portion between the lead frame 2 and the wire 7 can be further reduced. As a result, an adhesive force between solid resin R and the upper surface of the lead frame 2 can be further prevented from decreasing. Accordingly, an interface between the lead frame 2 and the solid resin R can be further prevented from being peeled, and a connection failure between the lead frame 2 and the wire 7 can be further suppressed.

The side surface of each of the second recesses 20b can be further increased. Accordingly, a contact area between the solid resin R and the lead frame 2 can be further increased, and the adhesive force between the solid resin R and the upper surface of the lead frame 2 can be further increased. As a result, the interface between the lead frame 2 and the solid resin R can be prevented from being peeled, and the connection failure between the lead frame 2 and the wire 7 can be further suppressed.

When the one end of the wire 7 is connected to not only the bottom surface of the first recess 20a but also the side surface thereof in the x-direction, a connection strength between the lead frame 2 and the wire 7 can be increased. Accordingly, the connection failure between the lead frame 2 and the wire 7 can be further suppressed.

Ninth Example

Figure 11A:
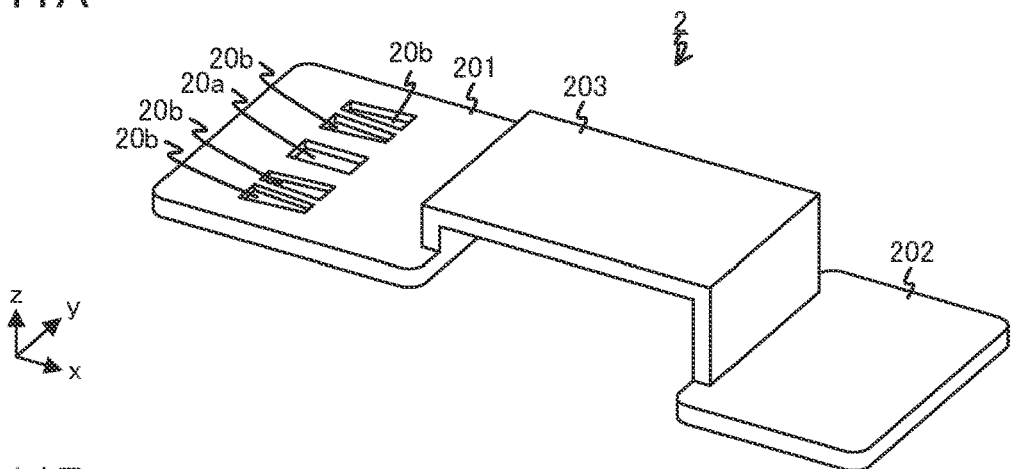
FIGS. 11A to 11D are diagrams illustrating a lead frame in a ninth example.
Figure 11B:
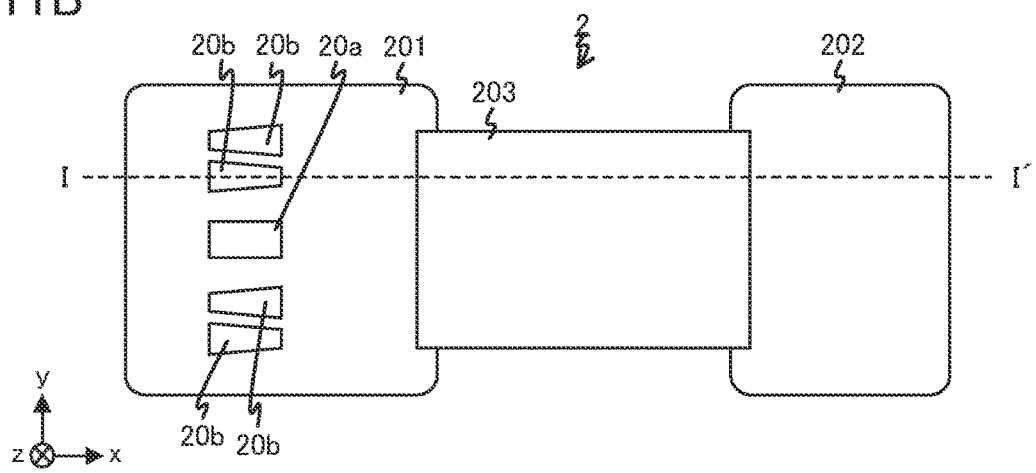
Figure 11C:
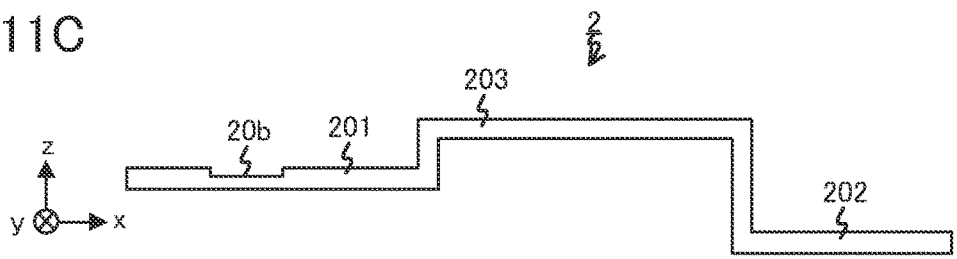
Figure 11D:
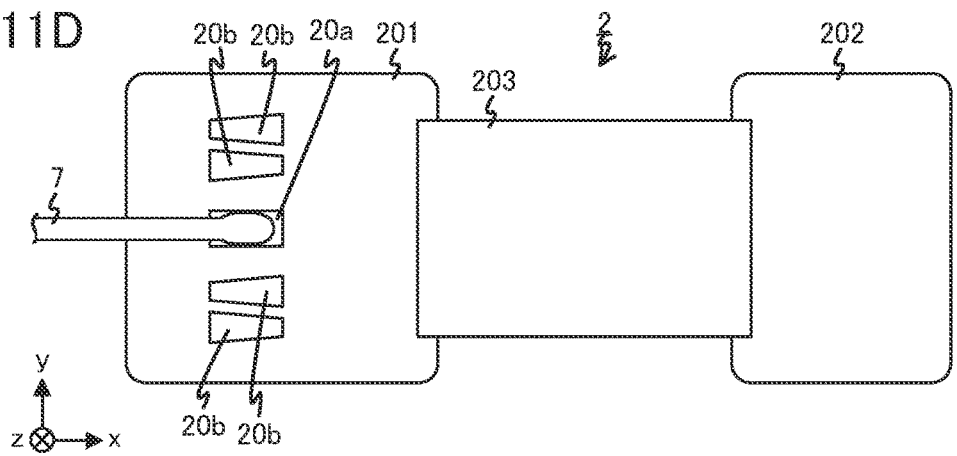

FIG. 11A is a perspective view of a lead frame 2 in a ninth example. FIG. 11B is a plan view of the lead frame 2 illustrated in FIG. 11A as viewed from the front side toward the rear side of a plane of paper in the z-direction. FIG. 11C is a cross-sectional view taken along a line I-I' of the lead frame 2 illustrated in FIG. 11B. FIG. 11D is a plan view in a case where one end of a wire 7 is connected to a bottom surface of a first recess 20a in the lead frame 2 illustrated in FIG. 11B.

The lead frame 2 illustrated in FIG. 11A to FIG. 11C differs from the lead frame 2 illustrated in FIG. 4A to FIG. 4C in that a shape of each of second recesses 20b formed in the one side (the positive side in the y-direction) of the first recess 20a and a shape of each of the second recesses 20b formed on the other side (the negative side in the y-direction) of the first recess 20a are asymmetrical. The first recess 20a and each of the second recesses 20b are formed by being recessed from the upper surface side of a first bonding section 201 by press working or the like.

In the lead frame 2 illustrated in FIG. 11D, the one end of the wire 7 is connected to the bottom surface of the first recess 20a by wire bonding. When the one end of the wire 7 collapses to expand in an elliptical shape at the time of connection, the wire 7 may be connected to the lead frame 2 such that the one end of the wire 7 is connected to not only the bottom surface of the first recess 20a but also a side surface in the x-direction (longitudinal direction) of the first recess 20a.

When the first recess 20a and each of the second recesses 20b are thus formed on an upper surface of the lead frame 2, the surface area of the lead frame 2 can be made larger by an amount corresponding to a side surface of the second recess 20b than when only the first recess 20a is formed. Accordingly, an amount of heat dissipation in the periphery of a connection portion between the lead frame 2 and the wire 7 can be further increased, and a rise in temperature in the vicinity of the connection portion between the lead frame 2 and the wire 7 can be further reduced. As a result, an adhesive force between solid resin R and the upper surface of the lead frame 2 can be further prevented from decreasing. Accordingly, an interface between the lead frame 2 and the solid resin R can be further prevented from being peeled, and a connection failure between the lead frame 2 and the wire 7 can be further suppressed.

When the first recess 20a and each of the second recesses 20b are formed, the surface area of the lead frame 2 can be further made larger than when only the first recess 20a is formed. Accordingly, a contact area between the solid resin R and the lead frame 2 can be further increased, and the adhesive force between the solid resin R and the upper surface of the lead frame 2 can be further increased. As a result, the interface between the lead frame 2 and the solid resin R can be further prevented from being peeled, and the connection failure between the lead frame 2 and the wire 7 can be further suppressed.

When the one end of the wire 7 is connected to not only the bottom surface of the first recess 20a but also the side surface of the first recess 20a, a connection strength between the lead frame 2 and the wire 7 can be increased. Accordingly, the connection failure between the lead frame 2 and the wire 7 can be further suppressed.

The number of second recesses 20b to be formed is not particularly limited, although four in the second example, the fourth example, the eighth example, and the ninth example.

The number of first projections 21a to be formed is not particularly limited, although two in the fifth example.

The number of second projections 21b to be formed is not particularly limited, although four in the sixth example.

Respective shapes and positions of the first recess 20a, the second recess 20b, the first recess 20c, the first projection 21a, and the second projection 21b are not limited to the shapes and the positions illustrated in the first example to the ninth example.

In the above-described embodiment, the number of semiconductor devices 4 and an arrangement portion of each of the semiconductor devices 4 are not limited to those in the above-described configuration, but are appropriately changeable.

In the above-described embodiment, the number of members constituting the semiconductor apparatus 1 and a layout of the members are not limited to those in the above-described configuration, but are appropriately changeable.

Although the insulating circuit board 6 and the semiconductor device 4 are components each formed into a rectangular shape or a square shape in a plan view in the above-described embodiment, the present invention is not limited to these shapes. The components may be each formed into a polygonal shape other than the above-described shape.

Method for Manufacturing Lead Frame 2

Figure 12:
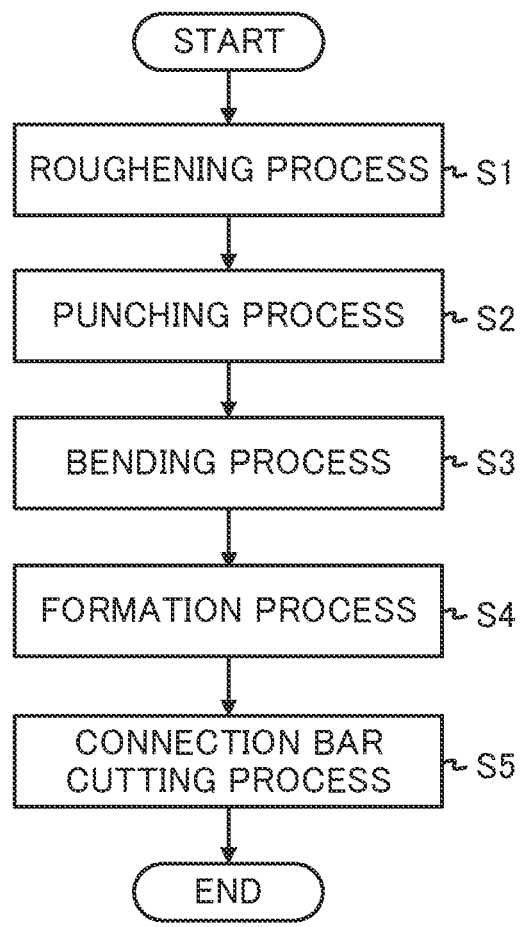
FIG. 12 is a flow chart illustrating an example of a method for manufacturing the semiconductor apparatus according to the embodiment.

Then, a method for manufacturing a lead frame 2 configured as described above will be described. FIG. 12 is a flow chart illustrating an example of the method for manufacturing the lead frame 2.

In step S1, a roughening process is first performed. In this process, a plurality of fourth recesses smaller than a first recess 20a to a third recess 20c, described above, is formed on an upper surface of a first bonding section 201. A metal plate as a material for the lead frame 2 is prepared. The metal plate is arranged such that its lower surface corresponding to a lower surface of the lead frame 2 contacts a lower metal mold having a flat surface. An upper metal mold having a predetermined convex shape formed therein is pressed from an upper surface of the metal plate corresponding to an upper surface of the lead frame 2. Thus, the plurality of fourth recesses is formed in a predetermined region on the upper surface of the metal plate. As a result, a contact area between solid resin R and the lead frame 2 can be further increased. Accordingly, an adhesive force between the solid resin R and the upper surface of the lead frame 2 can be further increased, and a connection failure between the lead frame 2 and the wire 7 can be further suppressed.

In step S2, a punching process is performed. In this step, the metal plate is punched out into a predetermined shape. The predetermined shape may be an external form in which some of a plurality of lead frames 2 are connected to one another via a connection bar (not illustrated).

In step S3, a bending process is performed. In this process, a predetermined portion of the lead frame 2 is bent and is molded in a crank shape. As a result, a first bonding section 201, a second bonding section 202, and a coupling section 203 are formed in the lead frame 2.

In step S4, a formation process is performed. In this process, the first recess 20*a*, the second recesses 20*b*, and the like are formed on an upper surface of the first bonding section 201 in the lead frame 2. For example, the lead frame 2 is arranged such that the lower surface thereof contacts a lower metal mold having a depression corresponding to the first recess 20*a* formed therein. An upper metal mold having a convex shape corresponding to the first recess 20*a* formed therein is pressed from the upper surface of the lead frame 2. As a result, the first recess 20*a* is formed on the upper surface of the lead frame 2, and a projection corresponding to the lower surface of the lead frame 2 is formed.

In step S5, a connection bar cutting process is performed. In this process, when a connection bar is cut, the plurality of lead frames 2 connected to one another via the connection bar is separated from one another. This process may also be performed by press working using two upper and lower metal molds.

All steps S1 to S5, described above, are implemented by press working. Therefore, boss formation and surface roughening can be implemented in a lower-cost configuration than when laser processing and a chemical solution are used. Each of the processes is merely an example, and the order of the processes is appropriately changeable in a range where no contradiction occurs. For example, the formation process in step S4 may be included in the punching process in step S2. The manufacturing method may include other processes such as plating treatment and rust prevention treatment.

As to Vehicle Including Semiconductor Apparatus 1

Then, a vehicle including the semiconductor apparatus 1 according to the embodiment will be described.

Figure 13:
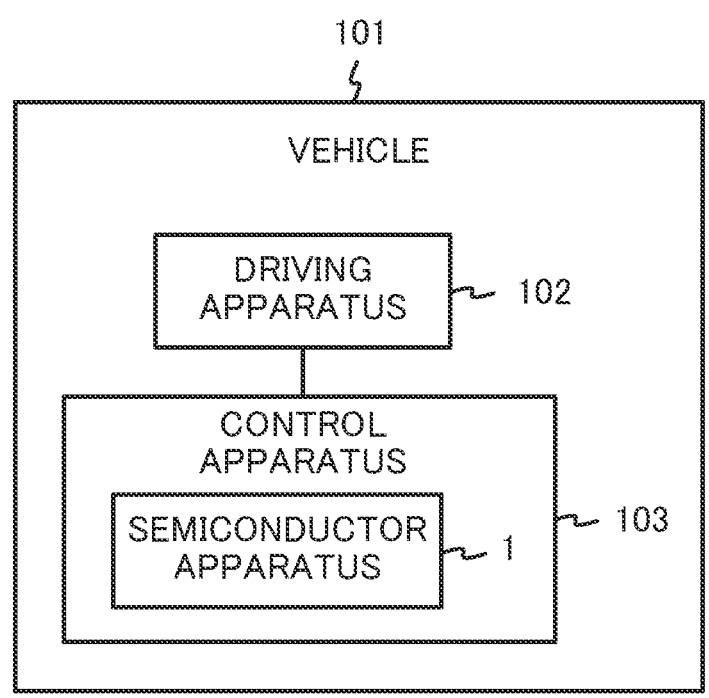
FIG. 13 is a diagram illustrating a vehicle including the semiconductor apparatus.

FIG. 13 is a diagram illustrating an example of a vehicle including the semiconductor apparatus 1 according to the embodiment. A vehicle 101 illustrated in FIG. 13 may be an eclectic vehicle using power of a motor or a hybrid vehicle using power of a motor and power of an internal combustion engine.

The vehicle 101 includes a driving apparatus 102 and a control apparatus 103.

The driving apparatus 102 may be composed of at least one of an engine, a motor, and a hybrid of an engine and a motor, for example.

The control apparatus 103 includes a semiconductor apparatus 1, and the semiconductor apparatus 1 controls an operation of the driving apparatus 102.

Although the embodiment and modified examples have been described, the present invention may be an overall or partial combination of the above-described embodiment and modified examples as another embodiment.

The present embodiment is not limited to the above-described embodiment and modified examples, but various changes, replacements, and modifications may be made without departing from the spirit of the technical idea. Further, if the technical idea can be implemented using another method by advancement of technology or derivative other technologies, the technical idea may be implemented using the method. Therefore, the claims cover all implementations that can be included in the scope of the technical idea.

As to Feature Points of Embodiment

Then, feature points of the above-described embodiment will be summarized.

A semiconductor apparatus according to the above-described embodiment includes a substrate, a semiconductor device arranged on an upper surface of the substrate, a lead frame bonded to an upper surface of the semiconductor device via a bonding material, a wire connected to a first recess formed on an upper surface of the lead frame, and a sealing material that seals the substrate, the semiconductor device, the lead frame, and the wire.

In the semiconductor apparatus according to the above-described embodiment, a side surface of the first recess and the wire contact each other.

In the semiconductor apparatus according to the above-described embodiment, one or more second recesses other than the first recess are further formed around the first recess on the upper surface of the lead frame.

In the semiconductor apparatus according to the above-described embodiment, the first recess extends to an end portion of the lead frame.

In the semiconductor apparatus according to the above-described embodiment, the second recess extends to an end portion of the lead frame.

In the semiconductor apparatus according to the above-described embodiment, one or more first projections are formed in a bottom portion of the first recess.

In the semiconductor apparatus according to the above-described embodiment, one or more second projections are formed around the first recess on the upper surface of the lead frame.

In the semiconductor apparatus according to the above-described embodiment, another recess is formed in a bottom portion of the first recess.

In the semiconductor apparatus according to the above-described embodiment, the second recess is formed into a shape surrounding the first recess.

In the semiconductor apparatus according to the above-described embodiment, shapes of the second recesses respectively formed on both sides of the first recess are asymmetrical.

A vehicle according to the above-described embodiment includes the above-described semiconductor apparatus.

As described above, the semiconductor apparatus 1 according to the embodiment has an effect of being able to improve a bonding strength between the lead frame 2 and the wire 7, and is usable as a driving control apparatus for a vehicle.

REFERENCE SIGNS LIST

1: semiconductor apparatus
2: lead frame
3: base substrate
4: semiconductor device
5: case
6: insulating circuit board
7: wire
8: terminal
9: terminal
10: terminal
11: insulating plate 12: heat dissipation plate
13: wiring
14: wiring
15: wiring
16: bonding material
17: bonding material
18: bonding material
19: bonding material
20: first recess
R: solid resin

What is claimed is:

1. A semiconductor apparatus, comprising:
a substrate;
a semiconductor device arranged on an upper surface of the substrate;
a lead frame bonded to an upper surface of the semiconductor device via a bonding material, the lead frame having a first recess on an upper surface thereof;
a wire connected to the first recess; and
a resin that seals the substrate, the semiconductor device, the lead frame, and the wire, wherein
one end of the wire is connected to not only the bottom surface of the first recess but also a side surface that extends in a longitudinal direction of the first recess.

2. The semiconductor apparatus according to claim 1, wherein a side surface of the first recess directly contacts the wire.

3. The semiconductor apparatus according to claim 1, wherein the lead frame further has one or more second recesses on the upper surface thereof that are provided around the first recess.

4. The semiconductor apparatus according to claim 1, wherein the lead frame has two ends that are opposite to each other in a direction that the lead frame extends, and the first recess extends to one of the two ends.

5. The semiconductor apparatus according to claim 3, wherein the lead frame has two ends that are opposite to each other in a direction that the lead frame extends, and each second recess extends to one of the two ends.

6. The semiconductor apparatus according to claim 1, wherein the first recess includes one or more first projections in a bottom portion thereof.

7. The semiconductor apparatus according to claim 1, wherein the lead frame includes one or more second projections on the upper surface thereof around the first recess.

8. The semiconductor apparatus according to claim 1, wherein the first recess has another recess provided in a bottom portion thereof.

9. The semiconductor apparatus according to claim 3, wherein each second recess surrounds the first recess.

10. The semiconductor apparatus according to claim 3, wherein the one or more second recesses are two second recesses which are respectively provided on the two sides of the first recess and have shapes that are asymmetrical with respect to each other.

11. A vehicle comprising the semiconductor apparatus according to claim 1.

* * * * *